United States Patent [19]

Ryan et al.

[11] 4,023,408
[45] May 17, 1977

[54] STORMSCOPE

[75] Inventors: Paul A. Ryan; Nicholas Spitzer, both of Columbus, Ohio

[73] Assignee: Dytronics Company, Inc., Columbus, Ohio

[22] Filed: June 10, 1976

[21] Appl. No.: 694,620

Related U.S. Application Data

[63] Continuation of Ser. No. 540,186, Jan. 10, 1975, abandoned.

[52] U.S. Cl. ............................ 73/170 R; 324/72
[51] Int. Cl.² ............................ G01W 1/00
[58] Field of Search .............. 73/170 R; 324/72; 340/172.5

[56] References Cited

UNITED STATES PATENTS

| | | | |
|---|---|---|---|
| 3,406,387 | 10/1968 | Werme | 340/172.5 |
| 3,508,259 | 4/1970 | Andrews | 73/170 R |
| 3,651,253 | 3/1972 | Morgand et al. | 340/324 A |
| 3,715,660 | 2/1973 | Ruhnke | 73/170 R |
| 3,753,117 | 8/1973 | Downing et al. | 73/170 R |

*Primary Examiner*—James J. Gill
*Assistant Examiner*—Anthony V. Ciarlante

*Attorney, Agent, or Firm*—Pollock, Vande Sande & Priddy

[57] ABSTRACT

A storm mapping system detects electrical activity caused by weather phenomena such as lightning strokes and the like and displays information related to the electrical activity as indicative of storm location with reference to an origin which is taken as the observer's location. A cathode ray tube (or other display means) provides a display and locations thereon are illuminated in response to the electrical activity. The azimuth of the display is indicative of the azimuth of the electrical activity. The distance from the reference location to any illuminated location is a function of the signal strength. Although signal strength is not a precise indicator of distance, it is a useful data item in that the more severe storms generate the maximum signal strengths. In contrast to the prior art systems, the storm mapping system of this invention illuminates a location whose distance from the origin is inversely related to signal strength. In this manner, electrical activity closest to the observer's location is displayed as such. The particular characteristics of the system render it convenient for use by a pilot since the information is so displayed as to be readily understandable without requiring an undue amount of mental activity on the part of the observer.

35 Claims, 24 Drawing Figures

*(Prior Art Display)*

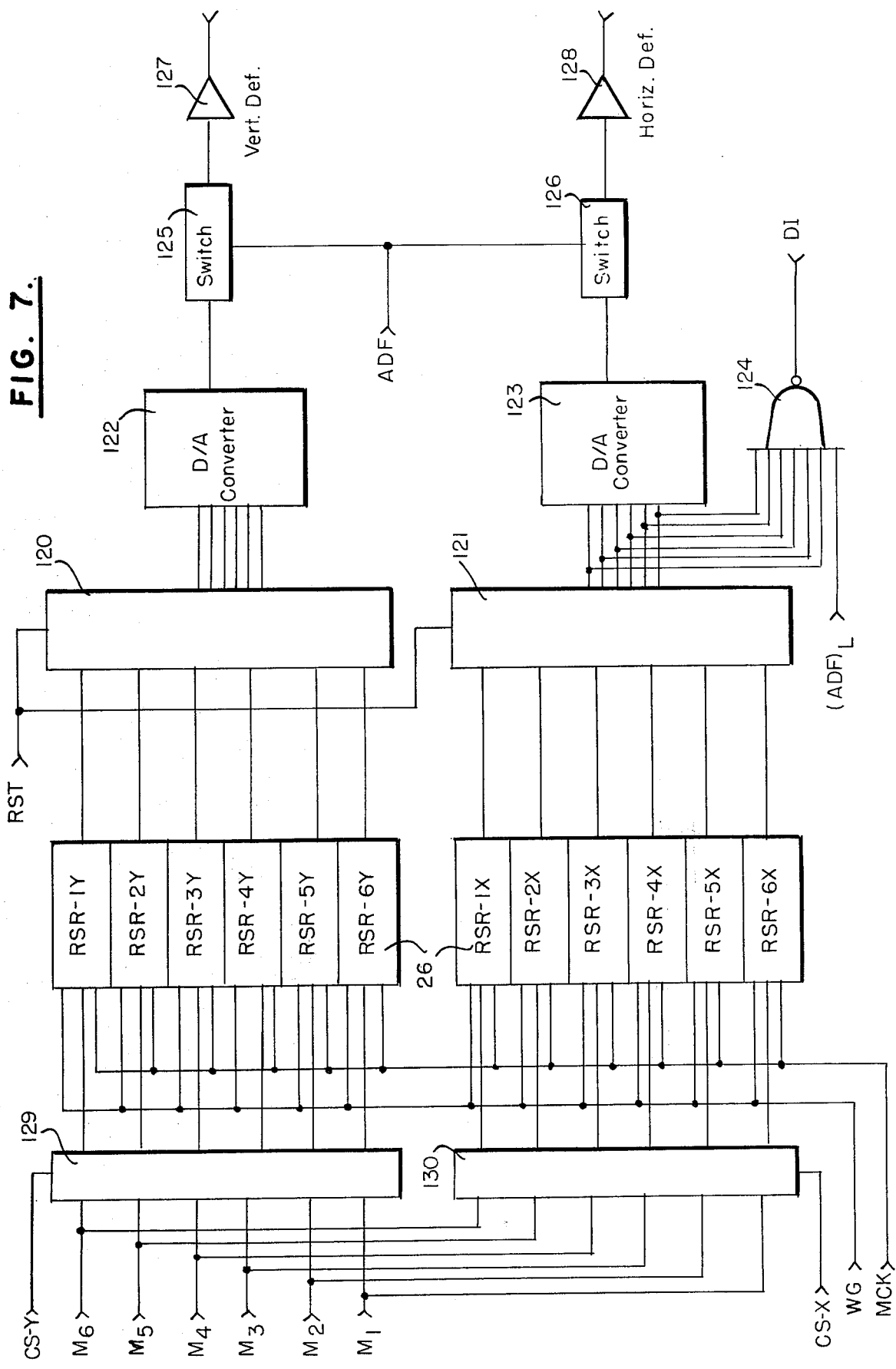

STORMSCOPE

This is a continuation, of application Ser. No. 540,186, filed Jan. 10, 1975 now abandoned.

In the system received signals are filtered. This includes a correlation between electrical and magnetic-field components to enhance the signals of interest. The filtered signals are also processed in a novel arrangement to be folded back.

Signal strength is assumed to be related to distance and through the foldback processing strong signals are displayed near the reference location and vice versa.

Furthermore, since the electrical activity is an extremely transient phenomenon, the detected and processed information is stored in a memory. The memory is scanned on a regular basis and the stored data is displayed for observation. Since storage of information is an integral part of the system, the system also has provisions for inhibiting the display of information which is so aged as to be out of date. In order to maintain the data in the memory current, the newest data received and processed is stored in memory locations so as to displace the oldest stored information. A modification includes means for updating the stored data to reflect changes in position of the observation location.

Since the signals of interest are relatively weak, the filtering means is rendered active only in the presence of signals of interest and then only for a predetermined period.

The cooperating features including monitoring for a predetermined period, correlation of signals, foldback and storage result in a system useful for airborne applications as well as ground based locations and sea going vehicles. Furthermore, the information that is being displayed is so readily comprehendible that it is useful by sole pilots. In addition, the system may cooperate with or have incorporated therein an automatic direction finding apparatus so that the display may replace the automatic direction finder display now usually found in the control panels of even small aircraft. As a result, further control panel space is not required for installation of the system. A common antenna may be used for both the storm mapping system as well as the automatic direction finder.

FIELD OF THE INVENTION

The present invention relates to a storm mapping, in real-time and display of atmospheric storms.

BACKGROUND OF THE INVENTION

By far the most common atmospheric storm is the thunderstorm. Approximately 44,000 thunderstorms occur daily over the surface of the earth, with about 2,000 in progress at any time. Because of their prevalence, as well as severity, the thunderstorm; is of primary importance. The need exists for mapping any storm having associated electrical activity, which includes tornados, snowstorms, sandstorms, and even clear air storms, which have reported electrical activity. The need for storm mapping includes:

1. Storm Avoidance,
2. Severe Storm Warning, and
3. Weather Prediction.

Storm avoidance is of great concern when traveling, and especially for air and sea travel. Warning of severe storms that may be approaching is sometimes important in order to minimize hazards to life and property. Weather prediction as related to approaching storms can be of great interest to those involved in agricultural and recreational pursuits.

We will devote our attention primarily to storm mapping and avoidance as related to air travel, since this application represents one of the greatest segments of use. The invention to be described, however, has application wherever storm detection and display mapping is needed.

Thunderstorms represent one of the greatest dangers to air travel. Such storm are characterized by turbulence, heavy rain, hail, and lightning. Turbulence is frequently so severe that there is a possibility of aircraft structural failure, causing crash. In less severe cases, passenger discomfort occurs. Hail can also cause severe damage to an aircraft, and can prove fatal. Pilots also prefer to avoid lightning and heavy rains. In summary, aircraft flight into thunderstorm regions can be perilous, and should be avoided.

The name of the thunderstorm originated from the sound produced by the storm. Since thunder is the result of lightning strokes, a thunderstorm is a storm having lightning.

There are two basic types of thunderstorms, classified according to the mechanism generating the storm. They are:

1. The Convective Thunderstorm
2. The Frontal Thunderstorm

The most common type of convective storm is caused by heating of the earth's surface by the sun. On a hot clear day, the earth's atmosphere is relatively transparent to the sun's rays, and therefore a substantial portion of the sun's radiant energy falling on the earth, heats the earth's surface. The warm layer of air near the ground starts rising, but the whole layer of air over an extensive area cannot rise simultaneously. Instead, air rises in discrete vertical channels or cells about a half mile in diameter. The cells of rising warm air are spaced in honeycomb fashion over the terrain, while in the spaces between them, colder air descends to take the place of the rising warm air.

As the warm air rises, cooling takes place. If the air contains sufficient moisture, condensation takes place, and a cumulus cloud begins to develop. If the humidity is high, these cumulus clouds continue to increase in size, with several grouping together to form even larger cloud masses. If conditions of temperature and humidity are proper, this "build up" process will continue until cloud tops are in the order of 25,000 to 40,000 feet or higher as they become fully developed storms.

This type of storm has its origin in the convective air currents from the ground, and are thus called "convective storms". These storms usually build up during the afternoon with the heat of the day, then dissipate by evening. However, there are types of convective storms that build up and occur at night especially over the sea. Convective thunderstorms are typically distributed over an area and exist as scattered groups of storm cells.

Another variety of thunderstorm is the frontal storm. Frontal thunderstorms are generated when a warm front flows into a colder air mass. The temperature gradient between the two masses of air causes the warmer air to rise. Again, if conditions of temperature and humidity are proper, the rising motion of the air will enter an unstable state called "free convection", whereby the vertical air movements gain momentum.

As this process continues, cells of thunderstorms are generated in much the same way as convective storms.

Frontal storms may cover an extensive area, and may occur day or night. These storms are generally electrically more active than convective storms.

Thunderstorms are composed of fundamental structural elements called cells. These cells vary in diameter from one to five miles. The structure of each cell is characterized by patterns of convective circulating currents, and the circulation in each cell is generally independent of surrounding cells in the same storm.

The life cycle of a cell can be divided into three successive stages usually lasting for several hours. The three stages are:
1. Cumulus Stage
2. Mature Stage
3. Dissipating Stage.

The chief distinguishing feature of the cumulus or building stage is the updraft throughout the entire cell. The speed of the updraft usually varies between a few hundred feet per minute, to several thousand feet per minute. During this stage, the updrafts are generally fairly uniform over a large area, and apparently do not give rise to turbulence of such severity as to be considered dangerous to aircraft in flight. The effect is to cause vertical displacement of the aircraft, but not with such abruptness as to cause aircraft failure. The temperature inside the cell is everywhere higher than the temperature of the air surrounding the cell at the same altitude. Although water droplets form within the cell, they are held in suspension by vertical air currents, and no precipitation normally falls out of the base of the cloud at this stage.

The mature stage of the thunderstorm is signified by rain from the base of the cloud. By this time the cell has usually attained a height of 25,000 feet or more, and the rain drops and ice particles have become so large that they can no longer be supported by the upward air currents. As precipitation falls, drag is exerted upon the surrounding air, giving formation of downdrafts. While these downdrafts occur, updrafts still exist giving rise to high shear currents. Although the downdrafts generally have lower velocity than the updrafts, they can still reach a velocity of several thousand feet per minute. Aircraft stresses caused by flying abruptly from a region of rising air currents to a region of falling air currents, or conversely, represent a serious threat to safety. Structural failure and resulting crash of the aircraft have frequently been the result.

The mature stage generally lasts from 15 to 30 minutes, while the life span of the cumulus stage is about 10 to 15 minutes. However, the thunderstorm is composed of several cells which continuously form and dissipate, so the life of the storm is usually much longer, and the area occupied by the storm is usually much greater than that of a cell. The mature stage is characterized by strong updrafts, strong downdrafts, intense gusts, heavy rain, hail, strong surface winds, turbulence, and electrical activity. The thunderstorm is most active in all respects during the mature stage. It is this correlation between storm activity and electrical activity during the mature stage that forms a basis for storm mapping and avoidance through distant measurement of signals radiated by the electrical activity.

As the cell progresses, the entire lower levels become an area of downdrafts, and vertical motion soon ceases in the upper levels. Soon there is a downward current throughout the entire cell and the rate of rainfall decreases to that of a steady shower. This is the final or dissipating stage of the thunderstorm cell.

During the cumulus stage of the thunderstorm, through a process not fully understood, a separation of electrical charge occurs. Commencing with the mature stage, or perhaps during the latter portion of the cumulus stage, electrical discharges and lightning develop. As a matter of note, the occurrence of electrical discharges and lightning coincides with the occurrence of dangerous turbulence and other violence.

Each lightning stroke begins with a weakly luminous predischarge called the leader. The leader seems to prepare the way for a more powerful surge of current called the return stroke. Each lightning flash as observed by the eye, is usually composed of several strokes in rapid succession. Following the flash, the cell "rests" for a while before generating another flash. However, since a storm typically is composed of clusters of cells that are in various stages of activity, the group of cells may produce many lightning flashes per second.

Prior to the first lightning stroke, a low current discharge ionizes the air by moving rapidly in small intermittent steps. This first leader is called the stepped leader. The current in the stepped leader rises to the peak value in less than one microsecond then decays until the next step. The time interval between steps is about 50 microseconds. The stepped leader lasts for about 20 milliseconds, and during this time an average current of about 100 amperes flows.

Immediately after the ionized path has been prepared by the step leader, an intensely luminous return stroke propagates between the charge centers. This return stroke travels in a direction opposite from the direction of travel for the leader. The current in the return stroke rises at a rate of about 10 kA/$\mu$sec, reaching a peak value of about 19,000 amperes in about 2 microseconds. The current slowly decays to one-half the peak value in about 40 microseconds. Currents of a few hundred amperes may continue to flow for several milliseconds.

The equation frequently used to express the current of the return stroke is:

$$i(t) = i_0 (e^{-\alpha t} - e^{-\beta t}) \qquad (1)$$

where,
$i_0 = 28{,}000$ amperes
$\alpha = 4.4 \times 10^4$ sec$^{-1}$
$\beta = 4.6 \times 10^5$ sec$^{-1}$ Equation (1) gives a peak current of 19,000 amperes, occurring at 5.6 microseconds. The time from peak to half value is 20 microseconds, somewhat less than the observed average value of 40 microseconds. Although not precise, equation (1) is a sufficiently good representation for many analytical purposes.

The lightning flash is the total discharge, whereas the stroke is a component part of the total discharge. Each flash has an average of four strokes, however flashes have been observed having as few as one stroke, and as many as 26 strokes. As mentioned before, the first stroke is preceded by a stepped leader. After the first stroke, if the continuing current lingers long enough, another stroke can occur without a leader. But usually successive strokes will also be preceded by a leader, but for all but the first stroke, the leader is a "dart" leader. The dart leader differs from the stepped leader in that it travels smoothly. The time interval between strokes is typically about 40 milliseconds, and the time duration of the flash is in the order of 200 milliseconds. A typical representation of current versus time for a single flash is shown in FIG. 1.

The presence of electrical charge produces a static electric field in accordance to Coulombs Law. When charge is put in motion, additional fields are generated in accordance with Maxwell's Equations. The field strengths are commonly represented as:

$$E = \left(\frac{1}{4\pi\epsilon_0 c^3}\right)\left\{\left(\frac{c}{d}\right)^3 [M] + \left(\frac{c}{d}\right)^2\left[\frac{dM}{dt}\right] + \left(\frac{c}{d}\right)\left[\frac{d^2M}{dt^2}\right]\right\} \quad (2)$$

$$H = \left(\frac{1}{4\pi c^2}\right)\left\{\left(\frac{c}{d}\right)^2\left[\frac{dM}{dt}\right] + \left(\frac{c}{d}\right)\left[\frac{d^2M}{dt^2}\right]\right\} \quad (3)$$

where,
$E$ = Electric Field Intensity (volts/meter)
$H$ = Magnetic Field Intensity (amperes/meter)
$\epsilon_0$ = Permittivity (farads/meter)
$c$ = Velocity of Light (meters/second)
$d$ = Distance from Discharge (meters)
$M$ = Total Electric Dipole Moment (coulomb-meters) (effective summation of each charge dipole moment)

Brackets are used to indicate "retarded values" accounting for velocity of propagation.

For the electric field, the first term which is directly dependent upon the electric dipole moment, is referred to as the electrostatic field or coulomb field. This component is inversely proportional to $d^3$. The second term depends upon the rate of change of dipole moment, or electric current, and is called the induction field. The induction field varies inversely as $d^2$. The last term in equation (2) depends upon the second time derivative of the electric dipole moment, and is referred to as the radiation field or the far field. This field component is proportional to the acceleration of electric charge and is inversely proportional to distance. At distances greater than one wavelength, only the radiation field is of significance.

From equations (2) and (3), it is apparent that the E and H components of the radiation fields are always proportional to each other. Regardless of the waveform of the lightning discharge, these two field components remain proportional. Although not expressed by these equations, the E and H fields are vector quantities and propagate in space orthogonal to each other, and orthogonal to the direction of propagation. It is this property that permits an arrangement of sensors to derive azimuthal information as is common with RF direction finding techniques.

Prior to the first lightning stroke, many smaller sparks and minor electrical activity are observed. Then immediately prior to the stroke, the stepped leader appears. These processes prior to the return stroke emit weaker radiation primarily in the HF and VHF radio spectra. Radiation emitted by the return stroke occurs mostly in the LF and VLF spectra, is of great intensity, and can propagate over extreme distances.

Since the low frequency portion of the spectrum is generated by the return stroke, equation (1) can be used to determine the spectrum. The radiated fields will depend upon the derivative of the current waveform, and therefore the derivative of equation (1). By differentiating and taking the Fourier transform, break frequencies at $\omega_L = \alpha$ and $\omega_H = \beta$ are determined. Or, $f_L = 7$ kHz and $f_H = 73$ kHz. The spectrum will have the general shape illustrated by FIG. 2 with the amplitude diminishing below 7 kHz and above 73 kHz at a 6 DB/octave rate. This calculation agrees reasonably well with the averages of measured data.

Until relatively recent times, the most widely used method for storm location and avoidance was simply by visual means. Perhaps this is still the most widely used means. In the case of air travel, many lives have been lost while depending upon this method. Thunderstorms are frequently embedded in stratified layers of clouds, and are not visible. This is particularly true when storms are associated with the movement of a warm front. The appearance of cloud formations are frequently very deceiving. While flying at night, cloud formations are not observable.

Radar echoes can be produced by water droplets. This fact makes radar useful for storm mapping and avoidance. The presence of water droplets is most always associated with storm activity. Radar has been used very successfully simply by mapping areas of precipitation, and assuming that the edges of these areas correspond to areas of greatest turbulence.

There are certain limitations on the use of radar. Although this method has been very successful, detailed studies illustrate that precipitation and storm activity do not have a one-to-one correspondence. For example, moderate or even heavy precipitation can occur from stable weather formations. Also there have been many reports of extreme turbulence without precipitation. Then too, frozen water, hail, does not give radar reflections, yet this represents a dangerous form of weather.

Ground radar installations are widely used to advise aircraft pilots of unsafe weather formations. These are very useful, but do have additional limitations. When observing weather, the radar operator must select a particular form of polarization. The best polarization for weather, does not give good details for moving targets (aircraft). So when a ground radar assists a pilot with weather, he usually does so at the sacrifice of traffic control and advisories. The work load of the ground radar operator sometimes does not permit weather assistance.

Ground radar is also somewhat limited in range. If there are many cells, very dangerous weather formations can be hidden from view by weather formations in front. Then there are yet many areas not covered by radar service. And the coverage becomes more restrictive at the lower altitudes.

Airborne weather radar is perhaps the most useful and successful method of storm mapping and avoidance. In addition to the above-mentioned limitations, airborne radar is limited by its high cost. Also, airborne radar can only be installed in aircraft having space for the radome housing the antenna. This means that it is generally limited to multi-engine aircraft.

It has long been recognized that electric and magnetic fields from lightning strokes can be sensed and displayed on a CRT screen in terms of azimuth and sensed intensity. The method developed in England by Watson-Watt and Herd for finding the direction of atmospherics is illustrated in FIG. 3. Crossed loop antennas are used to sense the radiated magnetic field, and nondirectional sense antenna responds to the electric field. In the illustration, the lightning discharge is displaced in azimuth by the angle $\theta$. The emf induced in the horizontal loop will be proportional to sin $\theta$, and the emf induced in the vertical loop will be proportional to cos $\theta$. When these signals are amplified and used as deflection voltages for the CRT, a diagonal line is generated across the CRT, rotated by the angle $\theta$. Since the deflection voltages are AC, the trace extends diagonally across the face of the CRT. If a wire antenna is used to sense the electric field, and if this signal is used for X-Axis blanking, half of the trace will be blanked. This happens because the electric and magnetic radiated fields are always in time phase. Since the loop antennas generate a voltage that is 90° out of phase with the magnetic field, it is necessary to use a phasing network in the sense channel to correct for this. By blanking half of the trace, the ambiguity is eliminated, and a radial line is generated corresponding to the azimuth of the lightning discharge. The length of the line corresponds to the intensity of the received signal. The closer the lightning discharge, the longer the line. See, for example Andrews, U.S. Pat. No. 3,508,259.

This type direction finder has been used on the ground for mapping thunderstorms. It is simple and operates well. There are good reasons why this device has not been suitable for airborne mapping and storm avoidance. As mentioned before, the length of the line increases as the distance becomes less. Actually the device responds to intensity, but intensity is primarily influenced by distance. This type display gives the pilot a poor spatial concept of the storm's threat to his flight. Also, the display records transient phenomena, which further makes interpretation very difficult. When used on the ground, time exposure photographs were sometimes made to aid interpretation. Contemporary "long persistence" CRT screens do not provide the requisite storage time, and contemporary storage tubes are not economical. Summarizing, this type direction finder does not display data in a manner suitable for airborne use by an aircraft pilot.

Automatic Direction Finders (ADF) are in common use in aircraft. These direction finders receive broadcast signals and display the direction of the transmitting station relative to the aircraft heading. Usually indication is by a mechanical pointer. These direction finders make use of the electric and magnetic fields radiated by the transmitting station.

It has been observed that the ADF indicator will point to a thunderstorm. This is not too surprising as a lightning discharge is a powerful transmitter. This characteristic has sometimes been used by pilots in an attempt to avoid thunderstorms. The technique is, however, very unreliable for this purpose. There is no indication of intensity, nor is there anyway for the device to point to more than one storm location. If activity is from more than one location, an averaging will result giving completely wrong results. Also, the indicator is not suitable for storing the transient data. Following a stroke, the indicator is free to wander, or to be influenced by other signals. Then too, the operating frequency has been chosen for transmitting stations, and not optimized for thunderstorm detection.

SUMMARY OF THE INVENTION

The present invention overcomes a number of the problems discussed with prior art storm detectors. In particular, the present invention includes a display for displaying electrical activity in which the displayed distance from the observation location to the illuminated point on the display is related to the distance between the observation location (which may be the aircraft on which the storm scope is located) and the electrical discharge.

In order to effect this the received signals are processed or folded back so that the displayed distances are inversely proportional to the signal magnitudes as received. In this fashion, the observer receives a good spatial concept as to his location with respect to the location of the electrical activity. The invention provides a memory for storing data for illuminating locations illustrative of electrical activity so that the extremely transient phenomena can be captured for easy reference.

Although a lightning flash which carries a peak current on the order of 19,000 amperes is a relatively strong transmitter, when attempting to detect this at a distance of 20 to 100 nautical miles, or more, extensive measures must be taken such that the observer is assured he is measuring signals of interest and is not focusing on noise or other unwanted interference. From the prior discussion it should be apparent that the storm scope is intended to operate on the far field (or radiation field) pattern generated by the lightning stroke. This pattern is characterized by electric and magnetic-field components which are in time phase. Therefore, the signals generated by the electric and magnetic fields are time correlated such that only electric and magnetic fields which are in time phase will generate signals that will be detected.

In addition, since the voltage or current induced in the magnetic-field sensors is related to the time rate of change of the magnetic field, integrators are provided to integrate the voltage or current induced in the magnetic sensors in order to obtain a measure of the magnetic-field intensity. The use of cross-loop magnetic field sensors enables azimuth information to be derived by the relative magnitude of the signals induced in the cross-loop sensors.

To further aid the apparatus in focusing on the signals of interest time domain sampling is employed. A combined signal is generated whose magnitude is related to the vector sum signals from the crossed magnetic-field sensors. This combined signal is provided to a comparator where it is compared with a threshold level. When the combined signal magnitude exceeds the threshold level a "window" is initiated. The "window" is terminated by a timer, and the integrators are allowed to integrate for a period of 0.5 milliseconds. Reference to FIG. 1, illustrates that each return stroke, is on the order of 70 microseconds long. Thus the 0.5 millisecond window enables the integrators to operate for a sufficient time to get a good measure of each stroke. Reference to FIG. 1 also indicates that the 40-millisecond period between strokes ensures that the measurement of one return stroke will not overlap the measurement of another return stroke, from the same cell.

At the conclusion of the measuring window signals are available, from the integrators, which relate to the intensity of the correlated electric and magnetic fields at the observation location. The signals, however, are not in condition for display since the larger signal statistically represent electrical activity which is closer to the observation location than the weaker signals. A novel foldback method of processing folds back the signals such that the larger intensity signals generate a display closer to the observation location allowing the observer a good spatial concept of the distance between himself and any electrical activity.

In order to effect the novel foldback method, a signal is derived which is related to the magnitude of the total magnetic-field intensity. In the particular embodiment disclosed herein the square of the signal is employed, although other powers of this signal could be used, including the first power. Each of the integrator signals, which represent intensity of the correlated electric and magnetic fields is then, in effect, divided by the square of the combined signal. In this fashion the folded back signal is smaller in magnitude for a larger received signal intensities and vice versa, the folded back output is larger for smaller received signal intensity.

The foldback process can be carried out with analog signals, and if it is, the folded back signal may then be converted to digital form and stored in a digital memory. In a preferred embodiment disclosed in this application, the foldback process and the analog-to-digital conversion process occur simultaneously. A number of digital memories can be used including random access core, random access active memories and some non-random access memories whose latency time is not so long as to be prohibitive. In this category are magnetic disc and drum memories and delay memories such as delay lines or shift registers. In a preferred embodiment disclosed herein, recirculating shift registers are employed as the particular memory.

Alternatively, foldback may be effected optically by the use of specially designed lenses or a plurality of fiber optic bundles. In the claims appended hereto the "processing means" which effects foldback may be electrical or optical in nature.

For display purposes, the memory is interrogated, sequentially, and the information stored therein, which relates to a single return stroke is displayed on a CRT tube. By sequentially scanning the memory each of the return strokes which have been measured and stored in the memory can thus be displayed on a CRT screen. Alternatively solid state or equivalent displays may be used as well.

Mention has been made of the advantages obtained by employing a memory to retain information locating the stroke so the display may be quasi-static as opposed to the extremely transient display that would necessarily result without the use of a memory. As the memory size must be finite and since it is arranged to write new data over the oldest stored data as long as the rate of acquisition of new data is sufficiently rapid the stored information is useful in avoiding areas of large turbulence. However if the rate of acquisition of new data gets too low the mere changing position of an aircraft (or other vehicle) may make the data obsolete. Disclosed herein is a modification of a preferred embodiment which includes data updating means to correct the stored data in light of the change in position of an aircraft.

BRIEF DESCRIPTION OF THE DRAWINGS

In this description the invention will be disclosed with reference to the attached drawings and in particular with reference to a preferred embodiment thereof; in the drawings like reference characters identify identical apparatus and furthermore;

FIG. 7 is a detailed block diagram of a portion of the apparatus of FIG. 4A;

DETAILED DESCRIPTION OF THE INVENTION

Figure 4A:
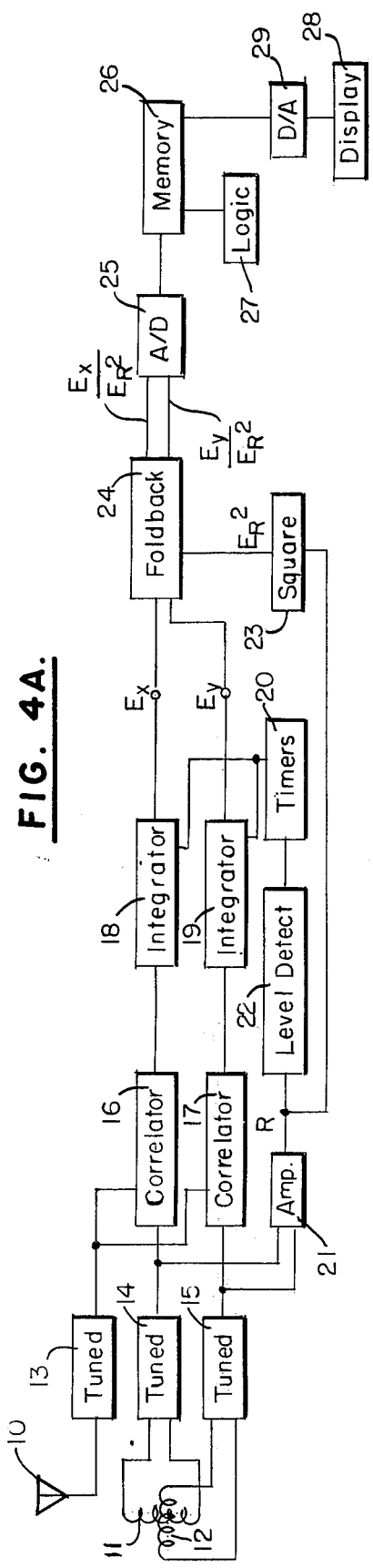
FIG. 4A is a block diagram of the apparatus of this invention.

FIG. 4A is a block diagram illustrating the apparatus of the invention. Before describing the manner in which the apparatus operates, a brief word is in order concerning the relationship between the field intensities detected by the sensors, the display of that information and the relationship with actual distance to the electrical activity which generated the fields. The average peak current in any return stroke making up a lightning flash is on the order of 19,000 amperes. Statistically, 98% of the return strokes have a peak current between 7,000 and 28,000 amperes. If we assume that each stroke has a peak current equal to 19,000 amperes, then the field intensity of the far field components will be a measure of distance from the observation location to the stroke. Knowledge of the actual distance from the observation location or storm scope location to the lightning stroke would be extremely useful. By assuming that each of the return strokes has a peak current of equal amplitude it is possible to calibrate the display in terms of distance. In fact, of course, there is an "error" in that strokes of peak current greater than the assumed 19,000 amperes appear closer than they actually are and strokes of peak current less than the assumed magnitude appear to be further away. This error is a useful approximation, however, in that strokes of stronger intensity appear closer and strokes of weaker intensity appear further away. Since under the state of present theoretical knowledge, turbulence is the activity which causes the stroke, strokes of higher than average intensity are thought to be associated with more than average turbulence. It would thus be wise to give such activity a wider berth than the average stroke. Therefore, in the remaining portion of the specification we will refer to a distance which is derived solely from the intensity of the field. The reader should be aware that the distance is not actual distance but is, in fact, a mix of distance and intensity information.

The block diagram of FIG. 4A illustrates the storm scope apparatus. In particular, a trio of sensors are used including electric field sensor 10, which may comprise a whip antenna or the like, and a pair of crossed magnetic field sensors 11 and 12 which may comprise ferrite core antennas for respectively detecting crossed magnetic field components. The output of each of the antennas is provided as an input to one of the tuned receivers 13, 14 and 15. Each of the receivers is broadly tuned with the center frequency of approximately 50 kilohertz. Since the magnetic field sensors respond to dH/dt and not to H, the receivers 13, 14 and 15 include a phase correction to allow the receiver outputs to be correlated. Since the far field E and H components are in time phase, the output of the tuned receivers 13, 14 and 15 generated by a far field will also be in time phase. The output of the receivers 14 and 15 are provided respectively to correlators 16 and 17. The output of the tuned receiver 13 is provided to correlators 16 and 17, as well. In addition, the output of the receivers 14 and 15 is combined in amplifier 21. The output of amplifier 21 is provided to a level detector 22 and also to an analog squaring circuit 23. The output of level detector 22 controls the plurality of timers 20.

The outputs of correlators 16 and 17 are provided as inputs to integrators 18 and 19 whose integration interval is controlled by the timers 20. The output of the integrators 18 and 19 are respectively signals representing the orthogonal vector components of the electromagnetic field sensed by the sensors 10 through 12. The output of the amplifier 21 is an R signal related to the total intensity of the electromagnetic field sensed and is a distance signal. The output of the squaring network 23 is the second power of this signal.

Figure 1:
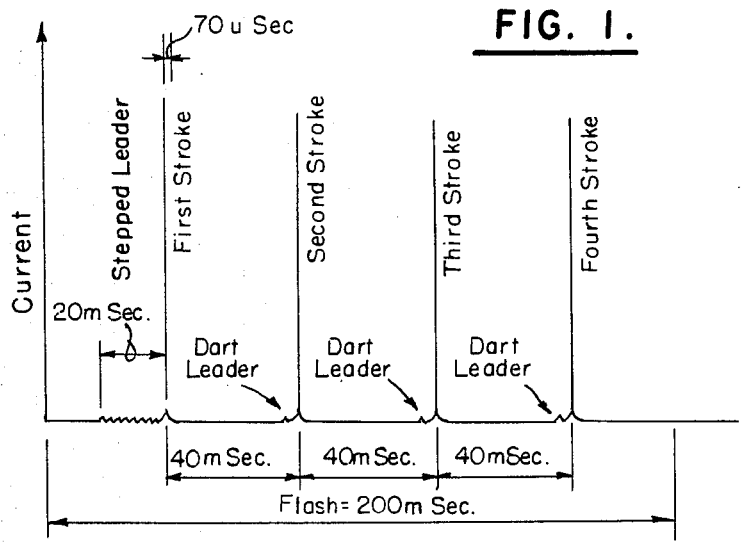
FIG. 1 is a representation of the current versus time for a complete lightning flash showing the statistically average flash with four return strokes.
Figure 2:
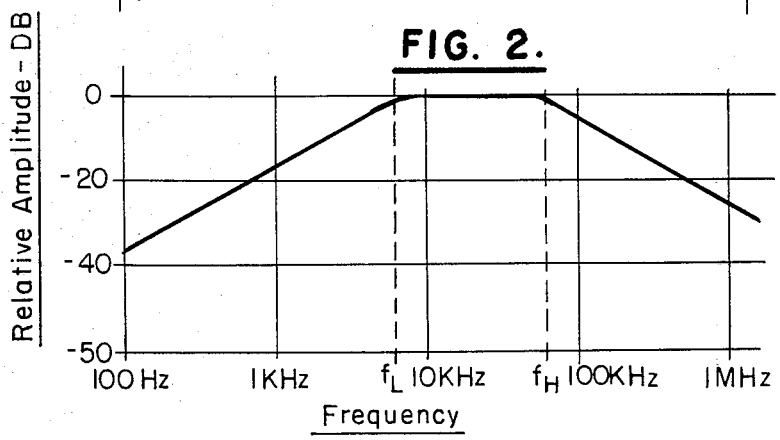
FIG. 2 is a representation of the frequency spectrum of the far field produced by a single return stroke.

In order to separately detect each return stroke, a measuring window is created by the timers 20. The window allows the circuitry to detect and measure the electromagnetic field components produced by the stroke. The average lightning flash is depicted in FIG. 1 and reference to that Figure shows that each stroke takes place in approximately 70 microseconds and that approximately 40 milliseconds elapses between strokes. In order to provide an effective margin for detecting the entire stroke the measuring window is open for a period of 0.5 milliseconds. Initiation of the window is based on the R signal which is the vector sum of the outputs of amplifiers 14 and 15. Since these receivers respond to cross-field detectors, their output is indicative of the vector components of the magnetic field. The output of amplifier 21, the vector sum of the outputs of receivers 14 and 15 is then related to the total signal intensity. This signal is provided to a level detector 22 which compares it against a relatively high reference voltage. The reference voltages is so chosen that the probability of its being exceeded by background noise is small. In one embodiment in which the combined gain of the amplifiers 14, 15 and 21 is approximately 5,000, the reference voltages chosen is 450 millivolts. When the R signal exceeds this level, a timer 20 is initiated which, by controlling integrators 18 and 19, controls the initiation and duration of the measurement window.

Since the far field components are relatively weak, additional signal filtering is provided by correlators 16 and 17. The desired signals, at the outputs of receivers 13, 14 and 15 are in time phase. The correlators 16 and 17 perform a filtering function producing, at their respective outputs, the signals of interest. Near field and induction field components of other signals are thus suppressed. In order to obtain a measure of the field intensity, integrators 18 and 19, respectively, integrate the outputs of the correlators 16 and 17 under control of the timers 20. At the conclusion of the integration period the signals at the output of the integrators 18 and 19 represent the orthogonal components of the electromagnetic field detected by the storm scope sensors.

In order to provide an observer with a display showing a good spatial relationship between the observer and the sensed return stroke, the analog received signals $e_x$, $e_y$ and $e_r2$ are folded back by a foldback network 24. Foldback network 24 provides a pair of outputs, one proportional to $e_x/e_r2$ and a second proportional to $e_y/e_r2$.

Figure 3:
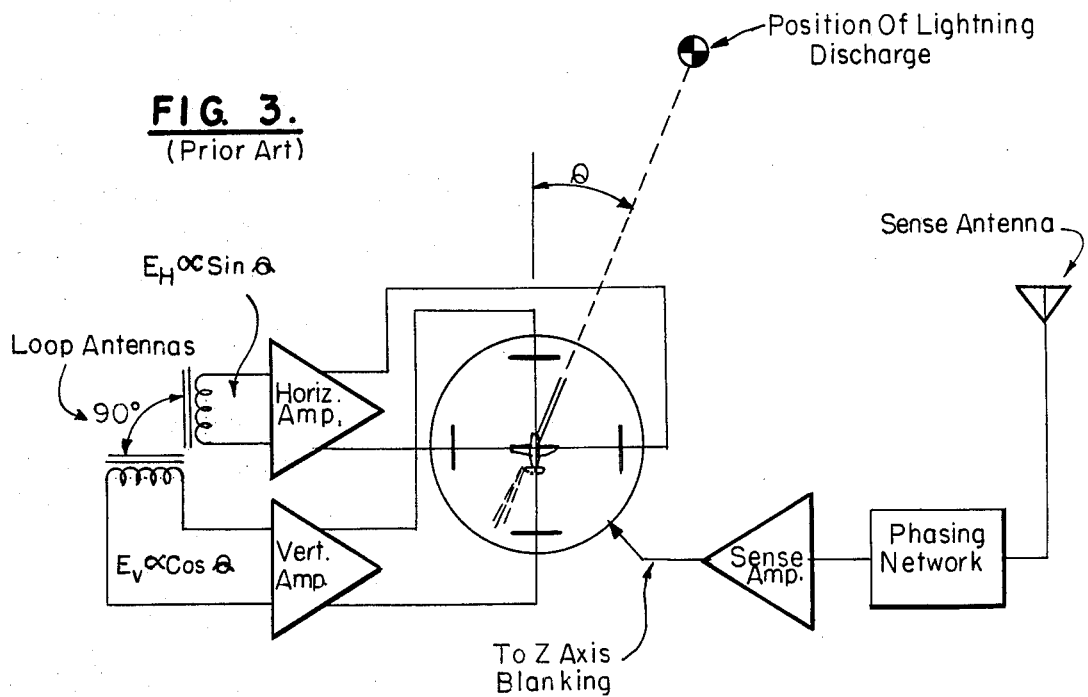
FIG. 3 is a representation of a prior art system.
Figure 4D:
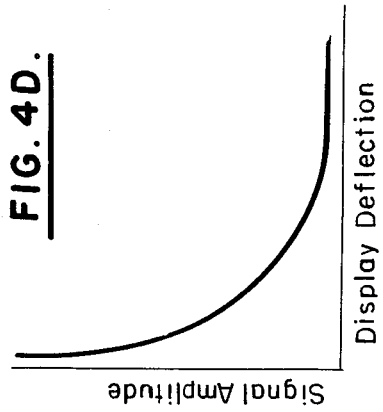
FIG. 4D is a representation of the relation between received signal magnitude and display deflection when using the apparatus of this invention.
Figure 4C:
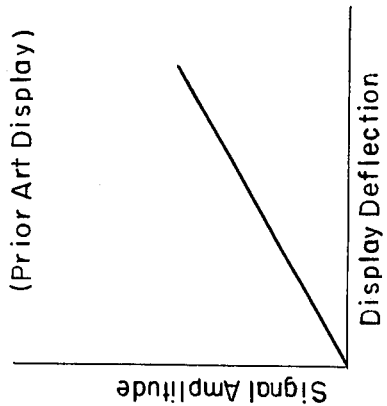
FIG. 4C is a representation of the relation between received signal magnitude and peak display deflection in the prior art system of FIG. 3.
Figure 4B:
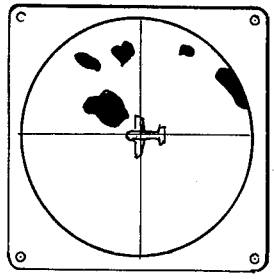
FIG. 4B is a representation of an illustrative display which would be produced by the system of FIG. 4A.

To explain the foldback process, refer to FIG. 3 which illustrates a typical prior art system in which the peak display deflection is linearly related to signal intensity. FIG. 4C shows a representation of the relationship between received signal intensity and peak display deflection for such a prior art display. The disadvantages of these displays have been referred to above. FIG. 4B illustrates a display in accordance with the teachings of this invention. In this display the illuminated location is closer to the origin, or observation location for high intensity signals and is further from the observation location for weaker signals. FIG. 4D illustrates the relationship between received signal intensity and display deflection in order to obtain a display such as that illustrated in FIG. 4B. Furthermore the apparatus of this invention employs a spot display in which only an area related to azimuth and distance of the electrical activity is illuminated. The prior art (of FIG. 3) draws a line from the observation location (origin) to the peak display deflection. It should thus be apparent that the inventive apparatus provides a display whose deflection is inversely related to the signal intensity. That is, as signal intensity increases display deflection decreases. As we have indicated, signal intensity is related to distance and with the display deflection of the inventive apparatus the display deflection is inversely proportional to this distance. Although the embodiment illustrated at FIG. 4A utilizes an inverse square relationship other inverse relationships could be used as well.

The folded back signals produced by the foldback network 24 (hereinafter referred to as processed signals) are then converted to digital signals by analog-todigital converter 25. These signals are then stored in a memory 26 under control of logic network 27. The memory 26 supplies information for the display 28 under control of the logic network 27. Of course, a digital-to-analog converter 29 converts the stored information to analog voltages for deflecting a CRT beam.

Although the embodiment illustrated in FIG. 4A relies upon digital memory and thus requires analog-to-digital and digital-to-analog converters, those with ordinary skill in the art will understand that suitable analog memories are available and the necessity for digital memories could be eliminated. Those of ordinary skill will also understand that the memory and display function may be combined by using a storage tube, LED or liquid crystal display.

In the remaining portion of this specification the implementation of the block diagram of FIG. 4A will be explained in detail.

Figure 5A:
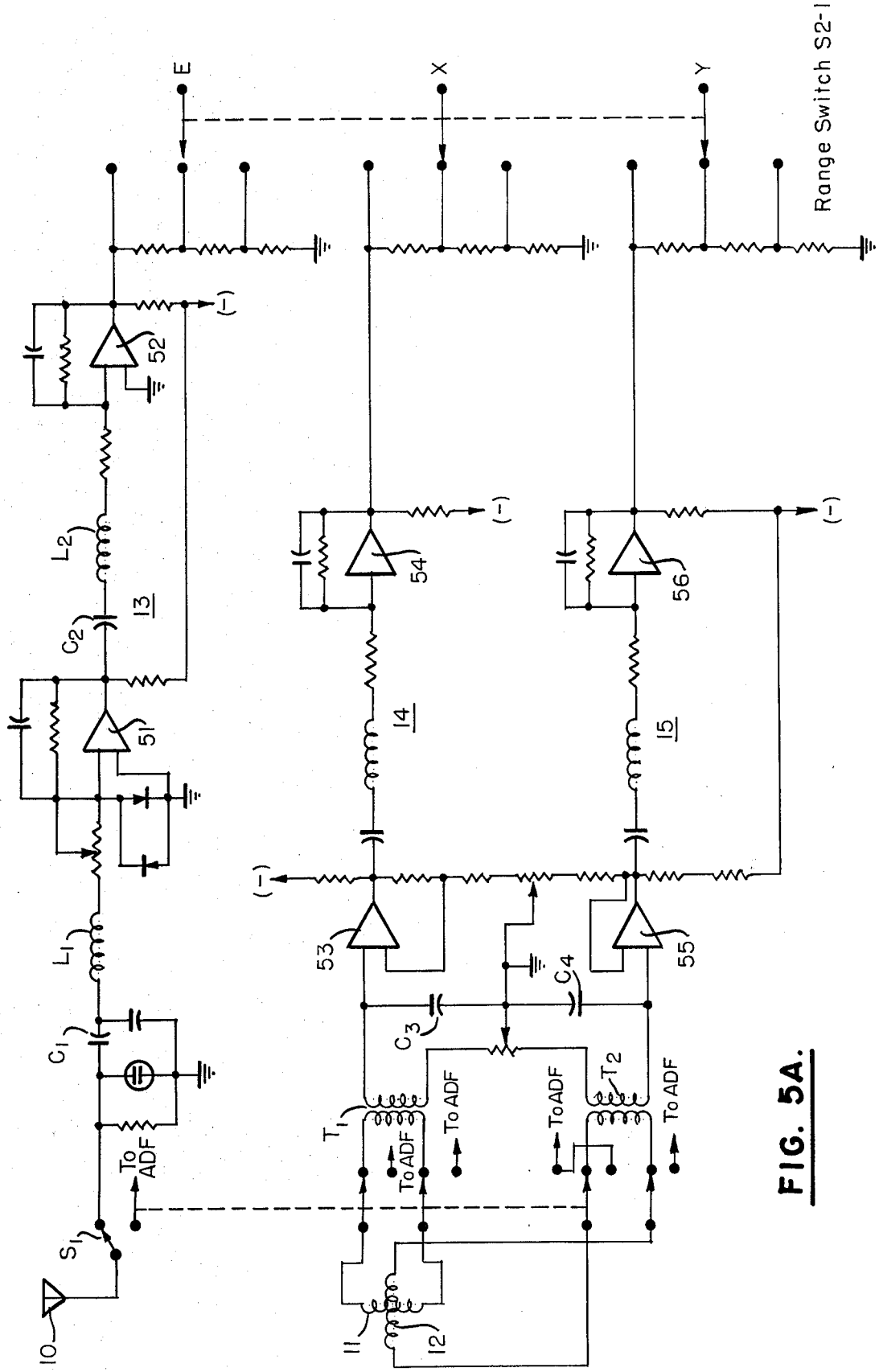
FIG. 5A is a circuit diagram of a portion of the block diagram of FIG. 4A.

FIG. 5A illustrates the tuned amplifiers 13, 14 and 15 and their connections to the electromagnetic field sensors 10–12.

Electric field sensor 10 is connected through contacts of switch $S_1$ to the tuned amplifier 13. When switch 1 is in the illustrated position it connects the electromagnetic field sensors to the storm scope. When switch $S_1$ is in its other position it may be used to connect the electromagnetic field sensors to an automatic direction finding apparatus. In this manner, the same electromagnetic field sensors can be used for both the storm scope and an automatic direction finder. Of course, if this capability is not desired, switch $S_1$ can be omitted. Also with a proper coupling apparatus the same antennas may simultaneously drive the storm scope and an ADF.

Connected to the appropriate contact of switch $S_1$ is a tuned amplifier 13 comprising amplifier stages 51 and 52. Each of the amplifiers has a series tuned circuit to select energy in the neighborhood of 50 kilohertz for amplification. These tuned circuits include inductors $L_1$ and $L_2$ and capacitors $C_1$ and $C_2$. The output of amplifier 52, (E), is available at contacts of range switch $S_2$–1. The three possible positions of this switch correspond to different ranges for full-scale deflection of the display which will be discussed hereinafter. Suffice it to say at this point that the range switch $S_2$–1 has its contacts connected to different points on a voltage divider.

The tuned amplifier 13 which has been discussed above, is in an E channel, so called because it relates to electric field intensity. FIG. 5A illustrates additional tuned amplifiers 14 and 15 which are in respectively X and Y channels. Each of these channels responds to orthogonal magnetic field components which are arbitrarity termed X and Y.

The tuned amplifier 14 comprises two stages of amplification including amplifiers 53 and 54. The input to an amplifier 53 is connected across a winding of a transformer $T_1$. The other winding of transformer $T_1$ is connected across contacts of switch $S_1$. In the illustrated position of switch $S_1$ the contacts of a winding of transformer $T_1$ are connected across magnetic field sensor 11. As discussed with respect to the electric field sensor 10, when switch $S_1$ is in the unillustrated position its contacts may be used to connect magnetic field sensor 11 to an automatic direction finder.

The input to the first stage 53 of the amplifier 14 is taken across the capacitor of a tuned LC circuit. In the E channel, that is the input to amplifier 51, FIG. 5A shows that the input is taken as the function of a current through resistor. The relative phase difference between E and X channels provides the phase correction, referred to above. In this manner, the far-field components produced by reason of a lightning stroke at the outputs of amplifiers 51 and 53 will be in time phase.

The output of the second stage of amplifier 14 is provided to other contacts of range switch $S_2$-1.

Tuned amplifier 15, the Y channel comprises amplifiers 55 and 56. The input to amplifier 55 is taken across the capacitor $C_4$ of the parallel $C_4$ of the parallel LC circuit much in the same manner as the input to amplifier 53. A signal is introduced to this circuit by a transformer $T_2$, one of whose windings is connected across the capacitor $C_4$. The other winding of transformer $T_2$ is connected to contacts of switch $S_1$ which, in the illustrated position, connect the winding of transformer $T_2$ across magnetic field sensor 12. The output of the tuned amplifier 15 is provided across a voltage divider to which is connected contacts of range switch $S_2$-1.

The signals available at terminals E, X and Y are functions of the energy sensed by sensors 10–12 in the neighborhood of 50 kilohertz. Since there may well be extraneous signals, that is induction and near-field components of extraneous signals, the signals available at these terminals may be contaminated and must be filtered before the signals of interest can be identified.

Figure 5B:
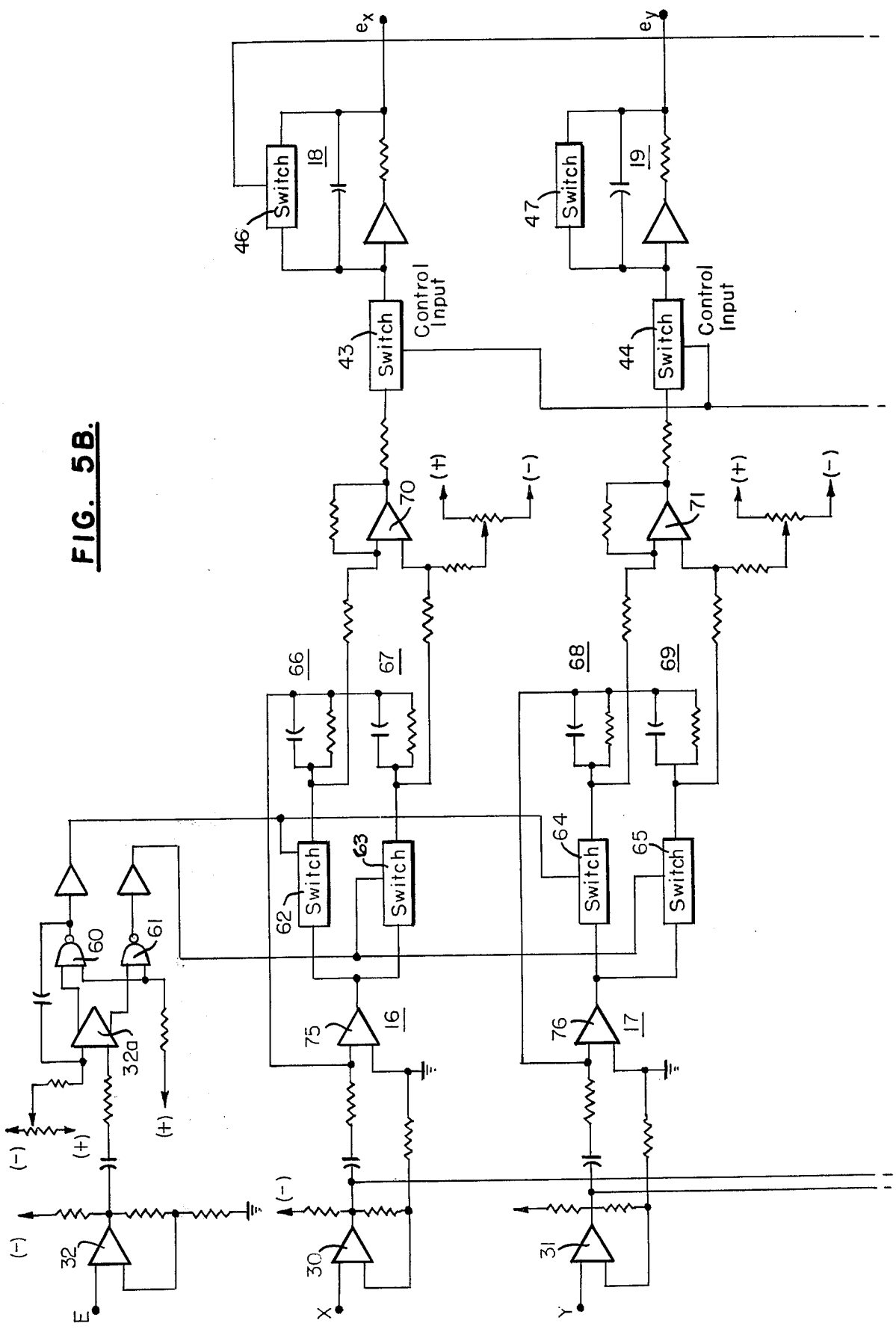
FIGS. 5B and 5D when placed together, illustrate a circuit diagram of a portion of the apparatus of FIG. 4A.
Figure 5D:
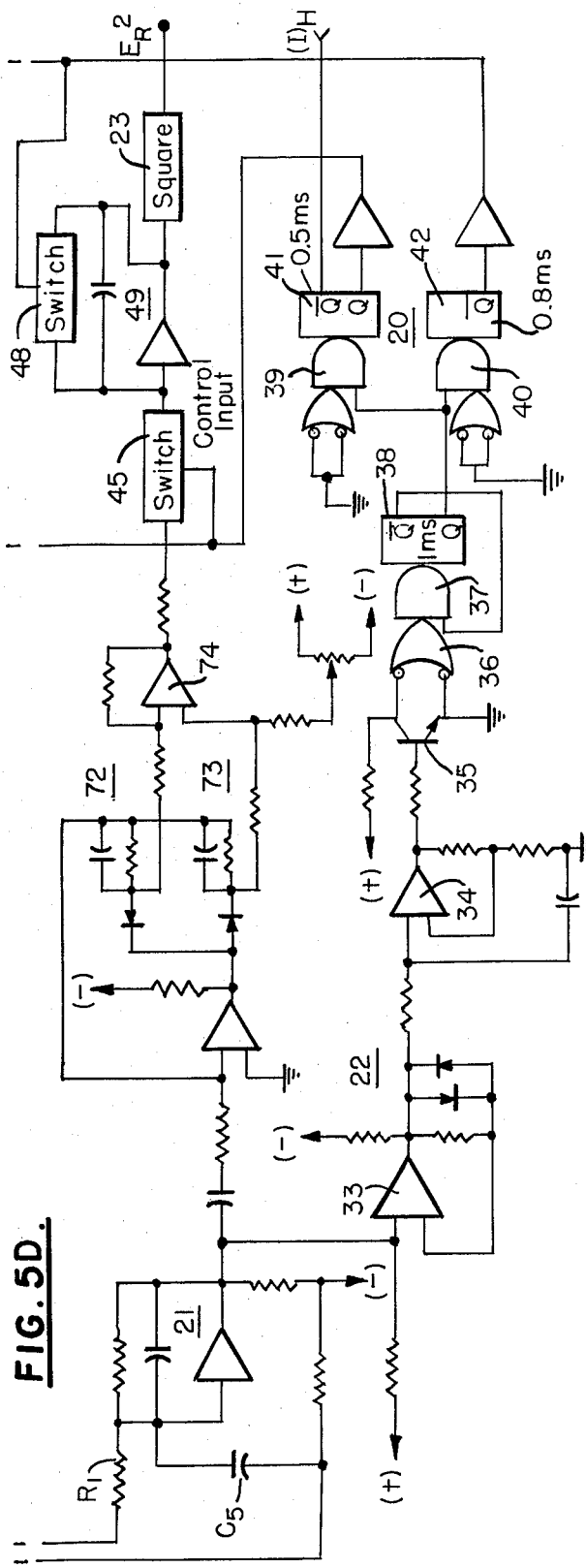

The E, X and Y signals are provided to the circuit illustrated in FIGS. 5(B) and 5(D) for the filtering functions of timing, correlating and integrating. Before explaining the circuit of in detail, the overall philosophy will be explained. The input to the circuit illustrated in FIGS. 5(B) and 5(D) is the three signals referred to above, E, X and Y. These signals are provided to three separate channels. A combination of the X and Y signals provides a signal which is operated on in a fourth or R channel. In addition, a level detection and timing function is performed in response to the signal level in the R channel and this comprises a fifth channel.

Since the timing functions control switches which control the integration process we will discuss, first, the timing functions.

As has been mentioned above the storm scope opens a measuring window in the presence of what is anticipated to be the leading edge of a stroke. Furthermore, this window is opened for 0.5 milliseconds and is then closed. In order to determine what is the leading edge of a stroke a level detection process is used. To effect this a signal is produced, the R signal, which is the vector sum of the X and Y signals. The X signal is provided to amplifier 30 and the Y signal is provided to amplifier 31. An output is taken from amplifier 30 and connected through resistor R1 to an input of amplifier 21. An output is also taken from amplifier 31 and is connected through capacitors C5 to the input of amplifier 21. This input provides proper phasing to sum these voltages and thus the output of amplifier 21 is the vector sum of the X and Y signals. This is provided as an input to the level detector 22. Level detector 22 comprises a limiting amplifier 33 and a comparator amplifier 34. Since there is a large variation between the normally expected noise background and the signals induced by a lightning stroke, or other interference, the limiter 33 prevents the larger signals from saturating the amplifier 34. The particular reference or threshold level that is selected for the operation of comparator 34 depends, of course, on the gain of the electromagnetic sensors and the gain in the circuits between the sensors and comparator 34. What is important is that the threshold be selected so that noise will not trigger the timing circuits. On the other hand, the threshold should be low enough so that the majority of the lightning stroke occurs after the threshold. In any event, when comparator 34 senses an input voltage exceeding the reference level it will fire turning on transistor 35. OR gate 36 is so connected to transistor 35 that when transistor 35 is nonconducting the OR gate does not produce an output. However, when transistor 35 conducts OR gate 36 produces an output to AND gate 37. The output of AND gate 37 is connected to the clocking input of a J–K flip-flop 38. This flip-flop is connected as a one shot whose period is one millisecond. The $\overline{Q}$ output of the flip-flop 38 is connected as the other input to AND gate 37. Thus, when the flip-flop is in the reset state, the $\overline{Q}$ output is high and AND gate 37 may be enabled by the output of OR gate 36. On the other hand, when the flip-flop 38 is timing out the one millisecond period, the low $\overline{Q}$ output prevents AND gate 37 from responding to any further inputs. The Q output of flip-flop 38 is provided as one input to each of AND gates 39 and 40.

The other input to AND gate 39 is provided by an OR gate which is so connected that its output is continually high. The output of AND gate 39 is connected to the clocking input of a flip-flop 41. Flip-flop 41 is connected as a one shot with a 0.5 millisecond period. The $\overline{Q}$ output of flip-flop 41 is provided as an input to each of switches 43–45. Switches 43–45 are solid-state devices which, when provided with a control input will connect their input to their output. Thus, during the 0.5 millisecond timing period of flip-flop 41 each of switches 43–45 will serve to connect their respective outputs to their respective inputs. The 0.5 millisecond period is the measuring window for the storm scope. When flip-flop 41 is reset, switches 43–45 are opened and the electromagnetic signals produced in the X and Y channels cannot reach the integrators 18 and 19. Thus, signals occurring outside the measuring window are ineffective. The same signal which initiates flip-flop 41 also enables AND gate 40. The other input to AND gate 40 is provided by an OR gate whose output is always high. The output of AND gate 40 is connected to the clocking input of a J–K flip-flop 42. This flip-flop is also connected as a one shot with a 0.8 millisecond timing period. The $\overline{Q}$ output of flip-flop 42 is connected as the input to switches 46–48. Switches 46–48 are connected across integrators 18, 19 and 49 such that, when the switches are closed the integrators are reset. Only when the switches 46–48 are opened may the integration process proceed. Since it is the $\overline{Q}$ output of flip-flop 42 which provides the control input for the switches 46–48, these switches are normally closed, connecting their respective inputs to their respective outputs. Thus, the integrators are normally clamped and not integrating. However, when flip-flop 42 is set for the 0.8 millisecond timing interval, switches 46–48 are opened allowing the integration process to proceed.

Figure 5C:
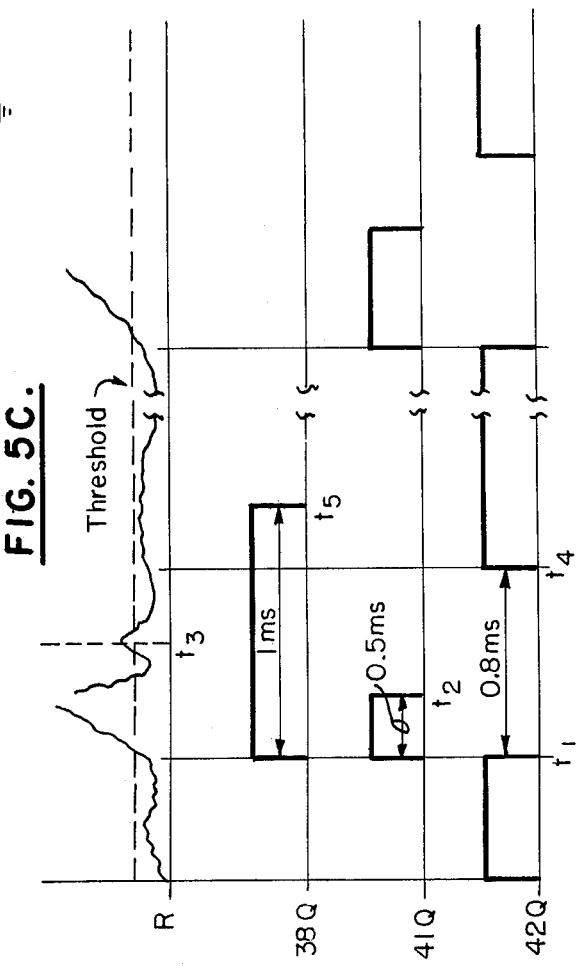
FIG. 5C is a representation of the timing outputs which define the measuring window.

FIG. 5C graphically illustrates the creation and duration of the timing windows and other timing functions performed by flip-flops 38, 41 and 42. Thus, on line R an illustrative representation of the R signal magnitude is shown in comparison with the threshold level for comparator 34. At time $t_1$, the R signal increases in magnitude above the threshold level. This sets flip-flop 38 and thus the Q output of flip-flop 38 goes high as is seen on line 38Q. This output remains high until time $t_5$ which is one millisecond after time $t_1$. By reason of the input connections to flip-flop 38, flip-flop 38 does not respond when comparator 34 senses the R signal exceeding the threshold at time $t_3$. At the same time as the Q output of flip-flop 38 goes high the Q output of flip-flop 41 goes high (as shown on line 41Q) and remains high for a period of 0.5 milliseconds, that is from time $t_1$ to time $t_2$. This is the measuring window. During this period of time switches 43–45 connect their outputs to their respective inputs. At time $t_1$, the initiation of the measuring window, the $\overline{Q}$ output of flip-flop 42 goes low and thus switches 46–48 are open allowing their integration process of their respective integrators to proceed.

Integration proceeds from time $t_1$ to $t_2$. At time $t_2$ the switches 43–45 disconnect their respective outputs from their respective inputs. This effectively stops the integration process. However, since the switches 46–48 remain open the output of the integrators is available subsequent to time $t_2$ and until time $t_4$. At time $t_4$ flip-flop 42 resets and thus its $\overline{Q}$ output goes high closing the respective switches 46–48 which clamps and resets each of the integrators.

The E channel signals, passing through amplifier 32 are provided to amplifier 32A. The input to amplifier 49 comprises an oscillatory signal, that is one that has both positive and negative values. In order to effect the correlation functions the single ended signal is transformed into a double ended signal by amplifier 32A. Thus, the positive going input signals are amplified and applied to an AND gate 60 and the negative going input signals applied to amplifier 32A produce positive going signals to AND gate 61. Since the other input to each of these AND gates is tied to a positive source of potential when each of them receives a positive going signal it will produce an output. The output of AND gate 60 is connected as the control input to switches 62 and 64 and the output of AND gate 61 is provided as an input to switches 63 and 65. These switches are similar to the switches 43–45 referred to earlier.

The X channel signals are applied to amplifier 30 and then to amplifier 75 from which outputs are provided to the inputs of each of switches 62 and 63. For X channel signals which are in phase with E channel signals the positive going X channel signals will be passed by one of switches 62 or 63 and the negative channel X signals will be passed by the other of switches 62 and 63. These signals will then be algebraically summed at differential amplifier 70. If the E and X channel signals are 90° out of phase, differential amplifier 70 will receive signals of like polarity on each of its inputs and thus the signals will tend to cancel out. The output of switches 62 and 63 are also connected to lowpass filters or envelope detectors 66 and 67. This insures that the outputs to differential amplifier 70 will change slowly.

In a like manner the Y channel is provided to amplifier 31 and then through amplifiers 76 to switches 64 and 65. The Y channel is also correlated with the E channel signals and the product is provided to differential amplifier 71. Similar low-pass filters 68 and 69 insure that the inputs to differential amplifier 71 are slowly changing.

In the R channel correlation is not necessary and instead diodes $D_1$ and $D_2$ are employed. However, the same low-pass filters 72 and 73 insure that the input to differential amplifier 74 changes slowly with respect to the 50 kilohertz signals.

Thus, when the R signal level provided to comparator 34 exceeds the threshold and a measuring window is initiated, the switches 43–45 provide the correlated inputs X and Y, and the R signal, respectively to integrators 18, 19 and 49. At the same time the measuring window is initiated, switches 46 through 48 are opened so that the integrators 18, 19 and 49 may proceed to integrate the signals applied thereto. It should now be apparent that the far field produced by each stroke is separately sensed and separately measured. At the conclusion of each 0.5 millisecond measuring window, the switches 43–45 are opened and thus the integrators 18, 19 and 49 hold the integrated values until the conclusion of the 0.8 millisecond period timed out by flip-flop 42. Thus, for 0.3 milliseconds the integrated voltages which will be termed $e_x$, $e_y$ and $e_r$ are available. Squaring circuit 23 produces $e_r^2$. These signals provide the input to the foldback unit 24 for subsequent processing.

The foldback circuit, memory apparatus, analog-to-digital, digital-to-analog converters and logic apparatus are illustrated in FIGS. 6 through 9. Before describing the foldback and analog-to-digital conversion, which is shown in FIG. 8, we will refer to FIG. 6 which illustrates the timing functions.

Figure 6:
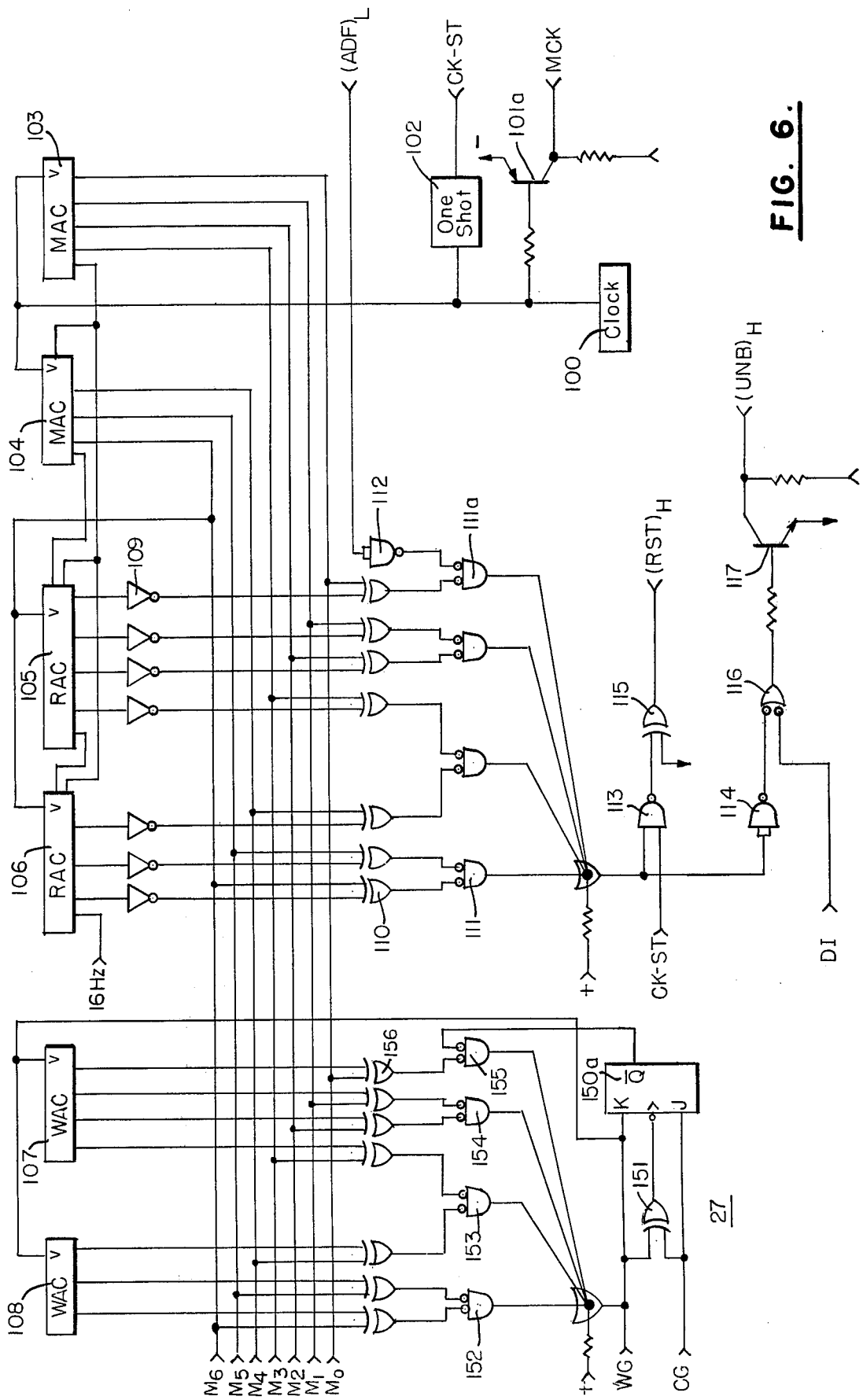
FIG. 6 is a part schematic and part circuit diagram of a portion of the apparatus of FIG. 4A.

FIG. 6 illustrates a clock 100 which produces a square wave to drive the counters, memory and logic functions. Although there is some latitude in choosing the particular frequency of the clock 100, we have used a clock frequency of 524.288 kilohertz, in apparatus built in accordance with the teachings of our invention. As the manner in which the clock operates the various counters becomes clear, those of ordinary skill in the art will understand the parameters that determine useable clock frequencies. A transistor 101 connected to the output of clock 100 produces a train of pulses MCK (Memory Clock) which is 180° out-of-phase with the pulse train produced by the clock 100. A one shot 102, also connected to the output of clock 100 produces a clock strobe or CK-ST of duration which is short compared to the period of the clock pulses. In the apparatus built in accordance with the teachings of our invention, we used a strobe period of 400 nano-seconds. The output of clock 100 is provided as the clocking input to a pair of four-stage counters 103 and 104. These counters are serially connected providing in effect an eight-stage divider. An output is taken from each of the four stages of counter 103 and is termed respectively $M_0$ through $M_3$. The carry output of the last stage of counter 103 is provided as the input to the first stage of the counter 104. Outputs of the first three stages of counter 104 are available and are termed $M_4'$ $M_5$ and $M_6$ respectively. These seven outputs $M_0 - M_6$ are the Memory Address. These signals are used to separately identify each memory location, as will become clear hereinafter. The carry output of the fourth stage of counter 104 is provided as the input to the first stage of a four-stage counter 105. Each of the four outputs of counter 105 is available through an inverting amplifier 109. The carry output of the last stage of counter 105 is provided as the input to counter 106. The first three outputs of counter 106 are available through an inverting amplifier 109. The clocking input to each of the stages of counters 105 and 106 is connected to the $M_6$ output of counter 104. Finally, the output of the fourth stage of counter 106 is available at the terminal labeled 16 Hz. By reason of the connections of counters 103 through 106, they comprise a 16-stage counter. Thus, with a 524.288 kilohertz input, the last stage of counter 106 will provide a 16 Hz output.

Counters 105 and 106 comprise a Read Address Counter (RAC) which controls the successive read out of stored information for display. In addition to these counters, another pair of four-stage counters 107 and 108 comprise a write-address counter (WAC). This counter has its clocking input connected to the write-gate (WG) a signal whose production will be discussed hereinafter. The write-address counter is updated by a signal called conversion gate (CG). The production of this signal will also be discussed hereinafter.

Although the read address counter (comprising counters 105 and 106) is an up counter, the output pulses provided by the inverting amplifiers 109 produce signals which comprise, in effect, a down counter. The signal provided by each of the inverting amplifiers 109 is compared with a different stage of the output of the memory address counter by a series of exclusive OR gates 110. Pairs of outputs from exclusive OR gates 110 are combined by AND gates 11. AND gate 111a derives one of its inputs from one of the exclusive OR gates 110 and a second of its inputs from a NAND gate 112. The input to NAND gate 112 is $(ADF)_L$. This nomenclature refers to a logic signal from an automatic direction finder indicating that it is in operation. Furthermore, the subscript L indicated that when the logic signal is present, the signal $(ADF)_L$ is at a low logic level. Thus, when the automatic direction finding logic signal is absent, the signal $(ADF)_L$ will be high. The NAND gate 112 will thus produce a low output which, when inverted at the input to AND gate 111, will enable the AND gate 111. Thus, when the automatic direction finding signal is absent and the read-address counter (106, 105) output is of the same digital value as the output of the memory address counter (103, 104), each of the AND gates 111 will produce a high output. The outputs of all the AND gates 111 are wired together in a virtual OR gate which provides one input to NAND gates 113 and 114. When the memory address counter and read address counter agree, the virtual OR gate will provide high inputs to both NAND gates 113 and 114. The clock strobe, being high for a short period of time produces a short negative going pulse at the output of NAND gate 113. The exclusive OR gate 115 is wired as an inverter and thus it produces a short output pulse which is the read strobe $(RST)_H$. The use of this pulse will be discussed hereinafter.

When the memory address counter and the read address counter are not in agreement, the input to NAND gate 114 will be low, producing a high output which, when inverted at the input to the OR gate 116, will be low. This will produce a low output into the base of transistor 117 maintaining that transistor nonconductive and providing a high signal or an unblanking signal $(UNB)_H$. However, when the read address counter and memory address counter agree, the output of transistor 117 goes low, blanking the display for a short period of time to reposition the electron beam of a CRT used for display.

The decode inhibit (DI) is a signal which is normally high and thus in this condition has no effect on the transistor 117. However, when the DI signal is detected, DI goes low, transistor 117 is turned on, and the display is also blanked. The reason for this blanking will appear hereinafter.

FIG. 7 is a detailed block diagram of the memory, memory input, memory output and memory-display interface. The memory comprises a plurality of recirculating shift registers 26. These are labeled RSR-1Y thru RSR-6Y and RSR-1X thru RSR-6X. Thus, for each of the X and Y channels, there are six recirculating shift registers. In apparatus built in accordance with the teachings of our invention, we have used 128 bit shift registers. Each data point, or point to be displayed, requires 12 bits, 6 bits for the horizontal deflection and 6 bits for the vertical deflection. Each of the recirculating shift registers is operated by the clock generated pulse train MCK. Thus, the outputs of memory address counter serve to uniquely identify each memory location. A six-bit buffer storage (or hex latch) 120 is connected to the output of each of the recirculating registers 1Y through 6Y. Likewise, another six-bit buffer storage 121 is connected to each of the recirculating shift registers 1X through 6X. Each of these six-bit buffer storage registers is clocked by the read strobe RST. Thus, the 12 bits in the last stage of each of the 12 recirculating shift registers at the occurrence of RST is clocked into the buffer storage 120 and 121. Each of the six-bit buffer storages 120 and 121 has associated therewith a digital-to-analog converter 122 and 123. Thus, the digital information represented by the 12 bits stored in the storage registers is converted to analog information. In the Y channel the digital-to-analog converter 122 makes this analog voltage available to the vertical deflection amplifier 127 through a switch 125. Similarly, in the X channel, the digital-to-analog converter 123 makes the analog information available to the horizontal deflection amplifier 128 though a switch 126. The switches 125 and 126 are normally closed so that the analog information reaches the vertical and horizontal deflection amplifiers. However, in the presence of ADF, that is when automatic direction finding information is to be generated, the switches 125 and 126 are opened by the presence of ADF.

As has been mentioned before, under certain circumstances, the display is to be blanked. One of the circumstances is the occurrence of the digital equivalent of the decimal number 63 (which has been chosen as the decode inhibit) for reasons which will appear hereinafter. Of course, the digital equivalent of this number is 111111. The NAND gate 124 is connected each of the outputs of the buffer storage 121. Another input to NAND gate 124 is $(ADF)_L$. When the six inputs from the buffer storage 121 are all high, indicating storage of the decimal number 63, and the ADF signal is not present, indicated by a high input on the $(ADF)_L$, input the NAND gate 124 will produce a low output. This is the decode inhibit (DI) which, through OR gate 116 and transistor 117 (FIG. 6), causes the unblanking signal (UNB) to go low, thereby blanking the display.

In order to explain the manner in which the signals $e_x$, $e_y$ and $e_r2$ are folded back and converted to digital information, reference will now be made to FIG. 8A.

Figure 8B:
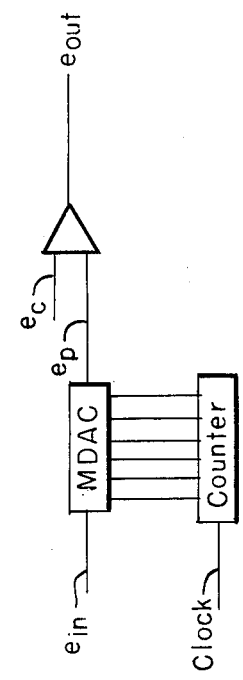
FIG. 8B is a simplified block diagram illustrating the foldback process.
Figure 8A:
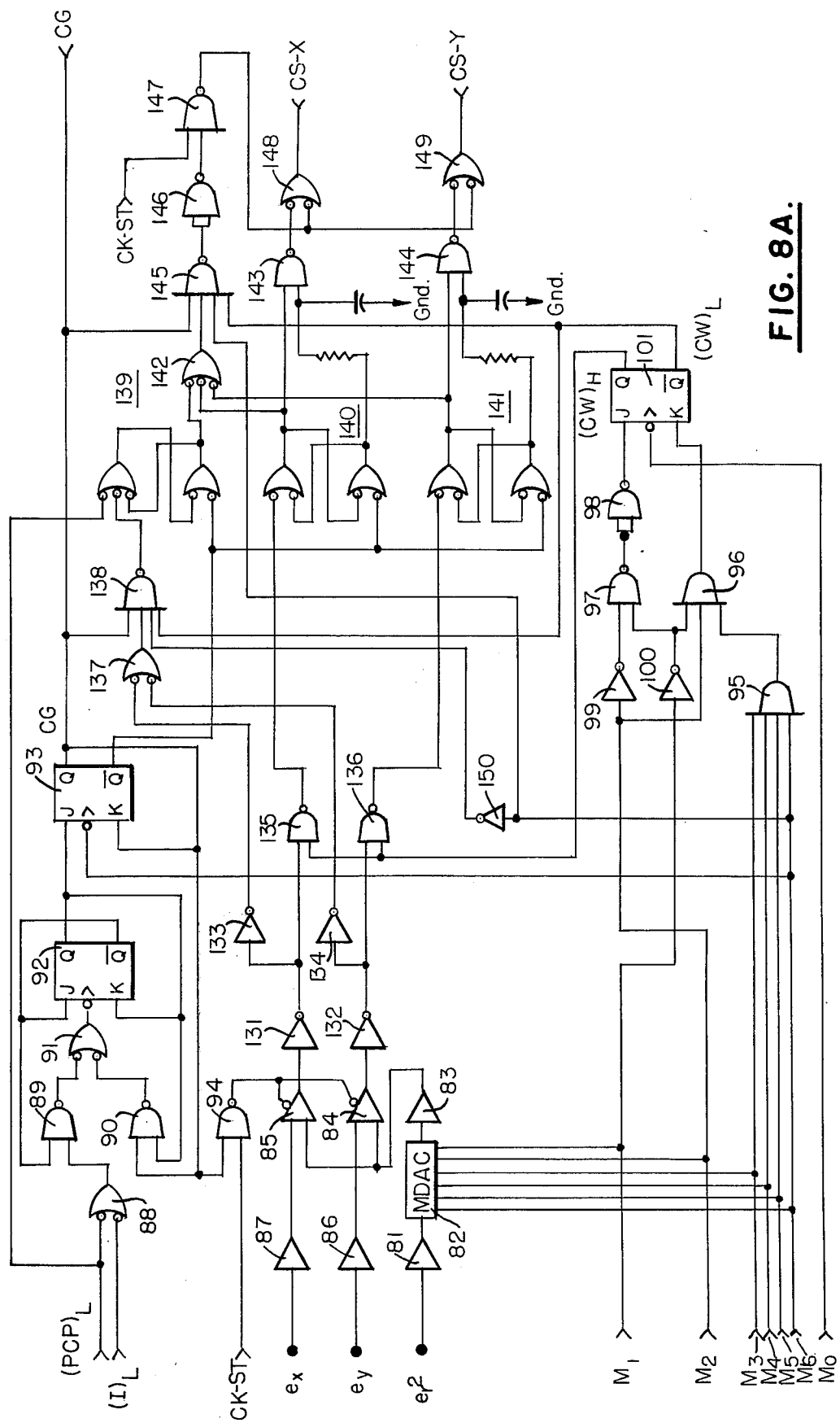
FIG. 8A is a schematic diagram of a portion of the apparatus of FIG. 4A.

In FIG. 8A, the voltages $e_x$, $e_y$ and $e_r2$ are provided as inputs. These are the signals produced by the apparatus shown in FIG. 5B. $e_r2$ is, after suitable amplification by amplifier 81, provided as an input to a multiplying digital-to-analog converter (MDAC) 82. The MDAC 82 accepts an analog input, digital inputs, and produces an output, in analog form, which is the product of its analog and digital inputs. The MDAC 82 has six digital inputs, being connected to $M_1 - M_6$ which are the outputs of six stages of the memory address counter. The output of MDAC 82, is, after suitable amplification in amplifier 83, provided as one input to comparators 84 and 85. The other input to each of these comparators is, respectively, buffered by amplifier 86 and $e_x$ buffered by amplifier 87. The comparators are strobed to be effective by CK-ST when, and only when, the alternate clock transistion that update the MAC occurs. Before describing the manner in which CG is produced, we shall digress and illustrate by example, the manner in which the foregoing apparatus provides analog-to-digital conversion and foldback.

FIG. 8B illustrates apparatus in which a clock drives six-stage counter, the output of which is provided as an input to an MDAC. An analog input to the MDAC is a voltage $e_{in}$. The output from the MDAC is an analog voltage which is the product of the foregoing two and is referred to as $e_p$. $e_p$ is provided as an input to a comparator whose other input is a voltage $e_c$. And finally, the output of the comparator is $e_{out}$. Although FIG. 8B illustrates a sixstage counter, obviously any number of stages could be used.

Figure 8C:
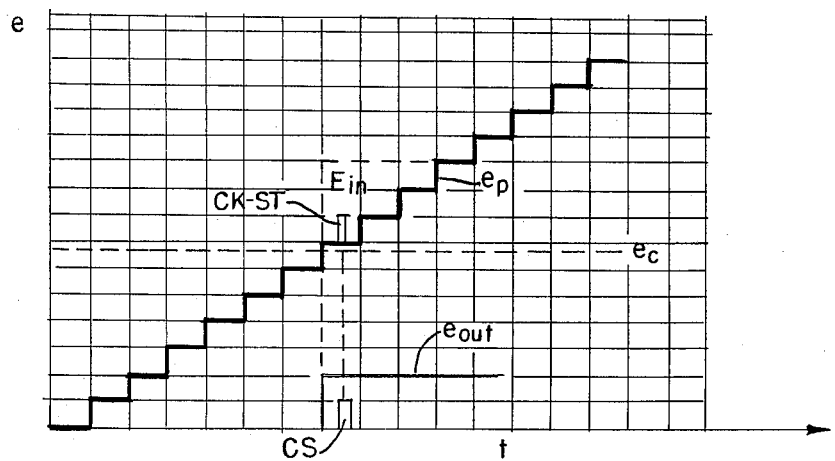
FIGS. 8C and 8D are representations of various pulses of the circuit.

FIG. 8C illustrates some of the waveforms involved. In particular, the output of the MDAC $e_p$ is illustrated as a staircase waveform. The slope of the staircase is the analog input to the MDAC, $e_{in}$. Superimposed on the waveform $e_p$ in the level of the other input to the comparator $e_c$. And, as is illustrated in FIG. 8C at a time when the voltage $e_p$ equals $e_c$ a comparator provides the output voltage $e_{out}$. Now at this time we can write the equation: $e_c = e_p$. At any time $e_p = e_{in} N(t)$ where $N(t)$ is the state of the counter.

When the equality exists, we can write, after rearranging terms:

$$N(t) = \frac{e_c}{e_{in}}.$$

Referring now to FIG. 8, we see that $e_c$ corresponds to $e_x$ or $e_y$ and $e_{in}$ corresponds $e_r2$. Therefore, the state of the counter $n(t)$ at the time of equality is a digital count which is a measure of the ratio between $e_x$ or $e_y$ and $e_r2$. Thus, foldback and analog-to-digital conversion had been accomplished, simultaneously.

Actually, the foregoing has to be modified in practice because, at the time $e_{out}$ is produced, as shown in FIG. 8C, the state of the counter N(t) is changing and is therefore indeterminate. For that reason, the apparatus illustrated in FIG. 8 strobes the comparator with CK-ST. The relevant CK-ST pulse is shown in FIG. 8C as well as the conversion strobe pulse which is produced as a result of the comparison process. Actually, before CS is produced, a number of checks have to be made. However, FIG. 8C illustrates that the timing of CS is a digital measure of the required folded back signal.

If we now refer to FIG. 7, we will explain the manner in which the folded back digital signals are applied to the memory. FIG. 7 illustrates a pair of six bit buffer storage devices (hex latches) 129 and 130. Each of these is connected to a different output of the memory address counter $M_1$ through $M_6$. It should be recalled that the same counter outputs operate the MDAC 82. At the time when the conversion strobe pulse is produced, the state of the counter is the digital number which is the folded back signal. Thus, either CS-Y or CS-X strobes the appropriate storage register to accept the state of the counter at that time. Subsequently, a write gate (WG) will be produced at an appropriate time to insert the digital values in the storage buffers 129 and 130 into the recirculating shift register at an appropriate location.

Reference to FIG. 5B shows that the signals $e_x'$ $e_y$ and $e_r$ are available from the output of integrators 18, 19 and 49. However, they are available only between times $t_2$ and $t_4$ (FIG. 5C). This is for the reason that prior to time $t_2'$ the integrators 18, 19 and 49 have not reached their final value and, subsequent to time $t_4'$ the integrators are reset and their outputs are driven to zero. Thus the conversion operation carried out by the apparatus of FIG. 8 must take place between $t_2$ and $t_4$. The one-shot 41 which produces the pulse between $t_1$ and $t_2$ is referred to an INTEGRATE $(I)_L$. This signal is provided as one input to OR gate 88. The other input to this OR gate is the persistence control pulse $(PCP)_L$. The generation and use of this pulse will be referred to hereinafter. However, for the time being we can assume that flip-flops 92 and 93 are reset. This assumption will be borne out as this description proceeds. At the conclusion of $(I)_H$ the high going trailing edge, coupled through the OR gate 88, will result in a low going edge provided to NAND gate 89. Since the other input to NAND gate 89 is the $\overline{Q}$ output of flip-flop 92, this is high, inasmuch as flip-flop 92 had been reset. Thus, a high going edge is produced by NAND gate 89. This is converted by OR gate 91 to a low going edge provided to the clock input of flip-flop 92. Since the J input of flip-flop 92 is connected to the $\overline{Q}$ output, at this time, it is high. Furthermore, since the K input is connected to the Q output, at this time, it is low. Thhis combination of signals then sets flip-flop 92. Thus, flip-flop 92 is set on the trailing edge of the I signal. At this time, flip-flop 93 is reset although its J input is now high, since the Q output of flip-flop 92 is high. The K input of flip-flop 93 is low. Thus, flip-flop 93 may be set upon a clocking input. Thus, the trailing edge of the next $M_6$ pulse sets flip-flop 93. The Q output of flip-flop 93 going high creates the CONVERSION GATE (CG). Thus, at the first occurrence of $M_6$ subsequent to the end of the integration interval CG is produced. This, in effect, synchronizes the conversion operation with the clock, which is necessary for the operation discussed in connection with FIG. 8C to take place. CG is provided as one input to NAND gate 94. The other input is CK-ST. Thus, so long as CG is available, each of the comparators 85 and 84 will be strobed by CK–ST and will be in condition to produce a conversion strobe. CG, however, is only high for one period of the $M_6$ signal. Since the Q output of flip-flop 93 is connected to the K input, upon the next occurrence of $M_6$ flip-flop 93 will reset. The resetting of flip-flop 93 is termination of CG. When flip-flop 93 resets its Q output goes low to thus disable NAND gate 94. At the same time, the Q output of flip-flop 93 provides a low input to NAND gate 90. NAND gate 90 thus produces a high output which, acting through OR gate 91 provides a clocking input for flip-flop 92. Since the J input of flip-flop 92 is connected to its $\overline{Q}$ output, which had been low, and its K input is connected to the Q output which had been high, flip-flop 92 is thus reset.

The foregoing explanation provides the necessary timing for the conversion operation. In particular, conversion can only occur subsequent to the integration interval and furthermore within the next period of the memory address counter. However, further checking must be accomplished before the data produced by the conversion process is validated for entry into the memory. In particular, if comparator 84 or 85 produced a comparison output in either the first or last pulse period of the memory address counter, the data is not considered valid. Furthermore, if the comparators 84 or 85 did not produce an output, then, again, no valid data has been received. As has been explained with reference to FIG. 7, a digital count of 63 is considered an invalid count and will cause inhibiting of the display if it is detected. The remaining portion of the apparatus then checks the conversion process for invalid data, and if such data is detected it forces the display inhibit code, 63, to be stored in the memory.

Figure 8D:
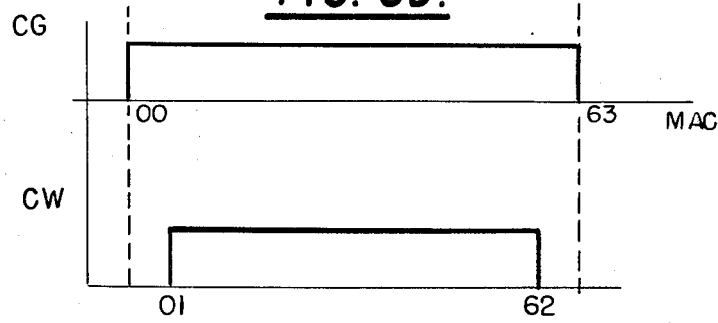

In order to effect this a signal called CONVERSION WINDOW (CW) is created. FIG. 8D shows the relationship between CG and CW. In particular, it will be recalled from the previous discussion that the leading edge of CG was synchronized with the memory address counter. Therefore, in FIG. 8D we show CG having a leading edge at a count of 00. Since there are 64 counts between the $M_6$ pulses which form the leading and trailing edges of CG we show in FIG. 8D the trailing edge of CG occurring at count number 63.

On the other hand, as we explained above, valid data is only that data which produces a comparison signal between counts 1 and 62. CW has leading and trailing edges which occur at pulse times 01 and 62. To create CW, the combination of AND gates 95 and 96, NAND gates 97 and 98, inverters 99 and 1000 and flip-flip 101 are provided. AND gate 95 receives inputs from memory address counter outputs $M_3$, $M_4$, $M_5$ and $M_6$. The output of AND gate 95 is provided as one input to AND gate 96, another whose inputs comes from the memory address counter stage $M_2$. An inverting amplifier 100 is connected to the output of memory address counter state $M_1$, and the output of inverter 100 provides the third input to AND gate 96, and one input to NAND gate 97. The other input to NAND gate 97 comes from an inverter 99 whose input is connected to the memory address counter stage $M_2$. The output of NAND gate 97 is fed, through an inverter 98 to the J input of flip-flop 101. The K input of flip-flop 101 is connected to the output of AND gate 96, and the clocking input of flip-flop 101 comes off the $M_0$ stage of the memory address counter. The Q output of flip-flop 101 is the CONVERSION WINDOW (CW). Only if the comparators 84 and 85 indicate a comparison within the period of CW is the data validated. If either of the comparators 84, 85 indicate a comparison outisde the period of CW the data is cconsidered invalid. CW extends for the period shown in FIG. 8D. The flip-flip 101 is reset at clock time 00, as will be clear fromthe following discussion. At clock time 00 the $M_1$ and $M_2$ outputs of the clock will be low resulting in high output of inverters 99 and 100. This will produce a low output of NAND gate 97 and a high output of inverter 98. At the same time, since each of stages $M_3$ through $M_6$ are low, the output of AND gate 95 will be low, thus resulting in a low output of AND gate 96. As a result, the production of an output from stage $M_0$ then clocks flip-flop 101 which becomes set. Thus, at clock time 01, the Q output goes high and $\overline{Q}$ output goes low. Since the K input of flip-flop 101 continues to receive a low input, the flip-flop will not reset until the outputs from stages $M_2$ through $M_6$ are all high and the output from stage $M_1$ is low. This produced a low input from inverter 98 and a high input from AND gate 96. Thus, on the next clock pulse, at time 62 the flip-flop resets.

The Q output of flip-flop 101 is provided as one input to NAND gates 135 and 136. Thus, during CW, these NAND gates are enabled. If, during the period of CW, either of the comparators 84 and 85 indicates a comparison, its high output, inverted by either inverter 131 or inverter 132 is provided as the other input to either NAND gate 135 or NAND gate 136. Thus, if a comparison occurs during CW, either the cross coupled OR gates 140 or the cross coupled OR gates 141 are set. That is, the upper OR gate produces a high output. The conclusion of CG resets all three cross coupled OR gates 139, 140 and 141 by providing a low input to the lower of the pair of OR gates. Thus, if either cross coupled OR gate 140 or cross coupled OR gate 141 is set during CW, it is because the respective comparator 84 or 85 indicated a comparison during CW. When that occurs, the setting of either cross coupled OR gates 140 or 141 causes the output of either NAND gate 143 or 144 to go low for a short period of time as determined by the RC combination on the input to the NAND gates. The low going pulse from NAND gates 143 or 144 produces a high output from either OR gate 148 or 149. This high going output is referred to respectively as CONVERSION STROBE X(CS-X) or CONVERSION STROBE Y(CS-Y). The use of this pulse will be explained in relation to FIG. 7.

However, we will first see how the apparatus of FIG. 8 responds to invalid data. If conversion is effected prior to CONVERSION WINDOW, but during CONVERSION GATE, then the four inputs to NAND gate 138 will all by high. One input will be high because CG is high, the second input will be high because either of the comparators 84 or 85 indicated a comparison, the third input will be high because the $M_6$ output of the memory address counter is low, and the signal is inverted by inverter 150 (FIG. 8A) and finally, the $\overline{Q}$ output of flip-flop 101 will be high indicating that the conversion window has not yet begun. Thus, this invalid data must be identified. The low going output of NAND gate 138 sets the cross coupled OR gate 139. This had been reset at the conclusion of the previous CG pulse. The setting of cross coupled OR gate 139 provides a low output from the lower OR gate which provides a high output of OR gate 142. This high output will remain through the occurrence of CW. At the conclusion of CW, NAND gate 145 produces a low output. The CG input is still high, OR gate 142 is producing a high output, $M_6$ is now high and since CW has concluded, the Q output of flip-flop 101 is high. Thus, NAND gate 145 produces a low output for the remaining duration of CG, see FIG. 8D. This low output is inverted by inverter 146 and produces a high input to NAND gate 147. When CK-ST goes high for its predetermined short period NAND gate 147 produces a short negative going pulse which is coupled through both OR gates 148 and 149. Since this is clock time 63, invalid date produces CS-X and CS-Y at clock time 63.

Referring now to FIG. 7, the invalid data which produces CS-X and CS-Y results in a number 63 being stored in buffers 129 and 130.

On the other hand, if conversion, that is, an output produced by both comparators 84 or 85, occurred during the CW period, then the data is considered valid. The low going output produced by comparators 84 or 85 is inverted by inverters 131 or 132 and produces a high input to NAND gate 135 or 136. Since this conversion has occurred during the period of CE, the other input to these NAND gates is also high and therefore the respective NAND gate produces a low output. This low output sets the respective cross coupled OR gates 140 or 141. When the upper OR gate of either OR gate 140 or 141 produces a high output, when it is set, either NAND gate 143 or 144 produces a low output for a short predetermined period of time. The period of this pulse is determined by the resistor and capacitor connected to the other input to NAND gate 143 and 144. The low going output of NAND gates 143 and 144 produces a high output from either OR gate 148 or 149. Thus, the output from comparator 84 or 85 immediately produces either CS-X or CS-Y. The state of the counter at the time of the comparison is thus stored in either buffer 129 or 130 upon the occurrence of CS-X and CS-Y.

From the foregoing, it should be apparent, that the magnitude of $e_x$ or $e_y$ is folded back and converted to digital data by the apparatus of FIG. 8. If conversion of either $e_x$ or $e_y$ occurs prior to CW or subsequent thereto, or if no conversion occurs for either $e_x$ or $e_y$, the digital number 63 is stored in both buffers 129 and 130 to indicate invalid data.

Now that the manner in which data is folded back and converted to digital form has been explained, we will, referring to FIG. 6, explain the manner in which it is inserted into memory.

In FIG. 6, the counters 107 and 108 comprise the Write-Address Counters. These counters are incremented by the high going edge of the WG signal. Each of the outputs of the various stages of counters 107 and 108 are connected to a respective input of an exclusive OR gate 156. The other input of each of these exclusive OR gates is connected to a different stage $M_0$ through $M_6$ of the memory address counter, 103, 104. When the count in the write-address counter matches the count in the memory address counter, each of the exclusive OR gates 156 will produce a low output. At no other time will each of the exclusive OR gates 156 produce low outputs. A plurality of AND gates 152–154 are connected to different pairs of the exclusive OR gates. AND gate 155 has an input connected to an exclusive OR gate 156 and a second input connected to the $\overline{Q}$ output of flip-flop 150a. When the two counts agree, the outputs of each of the AND gates 152–155 will be high, assuming that the $\overline{Q}$ output of flip-flop 150a is low, an assumption which will be borne out as this description proceeds. The outputs of each of AND gates 152–155 are connected together in a virtual OR gate and the concurrence of high outputs of each of these AND gates provides a high output of their common connection. This is the pulse called WRITE GATE (WG).

Referring now to FIG. 7, WG is connected to each of the recirculating shift registers that enables, upon the occurrence of WG, the data in buffers 129 and 130 to be applied to the recirculating shift registers. It should be apparent that WG should only occur at the conclusion of CG when the data in the buffers 129 and 130 is meaningful. Furthermore, the storm scope philosophy is to replace the oldest bit of data with each new bit of data in time sequence. Therefore, WG should also only occur when the oldest bit of data us available at the input terminals of the recirculating shift register.

Referring to FIG. 6, at the conclusion of CG the trailing edge provides a low signal to the J input of flip-flop 150a. The same signal, coupled through exclusive OR gate 151, clocks flip-flop 150a so that its $\overline{Q}$ output is low which enables AND gate 155. Subsequently, when the memory address counter reaches a count equivalent to that in the write-address counter WG is produced. The trailing edge of WG, itself, then serves to increment the write-address counter. The trailing edge of WG also resets flip-flop 150a, producing a high $\overline{Q}$ output. This prevents subsequent production of WG until after an intervening CG has set flip-flop 150a.

Referring now to FIG. 7, the memory address counter (103, 104) establishes and relates each data position within the shift register memory 26 to an address number. In serial order each data point stored in memory is read out to buffers 120 and 121 which serve to drive the horizontal and vertical deflection of a CRT beam. On the next match of memory address counter and read address counter, the data in buffers 120 and 131 is replaced by new data from memory 26. During the set up time of buffers 120 and 121, the CRT is blanked.

On the input side each received signal exceeding the threshold produces an I signal. During this time the correlated received signals are integrated. At the conclusion of I, CG and CW is produced and during CW, valid data conversion takes place. This data is stored in buffers 129, 130 for later insertion into memory 26. If invalid data is detected the inhibit code 63, (DI) is stored in the buffers 129, 130. At the conclusion of CG, flip-flop 150a is set, ready to produce WG. On the next match of the contents of the MAC and the WAC, WG is produced. This allows the data in buffers 129, 130 to be inserted into the memory 26. At the conclusion of WG the write address counter is incremented and flip-flop 150a is reset. This disables further production of WG until the next trailing edge of CG. Since WAC is incremented only by the insertion of new data, the oldest data is continually being replaced by the newest data.

The detailed discussion of FIGS. 6, 7 and 8 has indicated the manner in which the analog magnitudes of $e_x$ an $e_y$ are folded back, converted to digital values, stored and readout, converted back to analog form and displayed on a CRT.

The use of a memory overcomes the transient nature of the data and allows persistent display for convenient observation. However, the memory also has the property that the data is maintained and, if new data is not provided, the data which is stored in the memory may become stale, that is, out-of-date.

Figure 9:
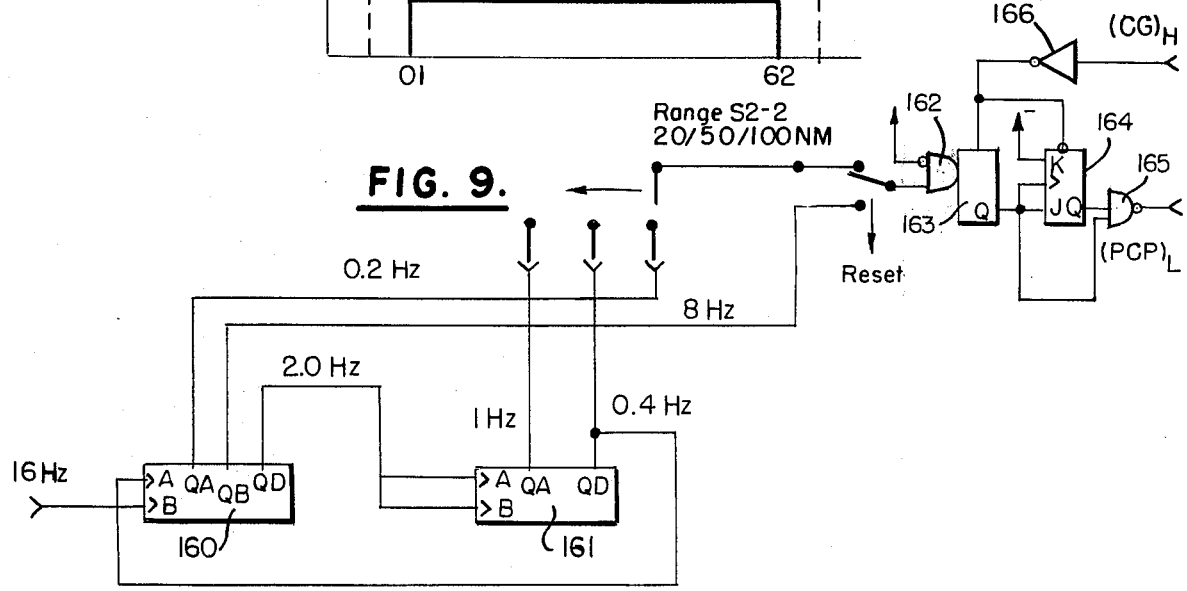
FIG. 9 is a schematic diagram of a portion of the apparatus of FIG. 4A.

The apparatus of FIG. 9 compares the rate of occurrence of new data, takes into account the selected range, and, if the rate of acquisition of data is too low, provides for the cancellation of old data. In order to effect this, a pair of four-stage counters 160 and 161 are fed with a 16 HZ signal from counter 106 (FIG. 6). The counters 160 and 161 make available signals of 1 HZ, 0.4 HZ and 0.2 HZ. These are respectively connected to different contacts of the range switch $S_2$-2. At the same time, the rate at which new information is being acquired is directly proportional to the frequency of CG, since a CG signal is produced for every data point received.

With the range switch $S_2$-2 in the illustrated configuration, the 0.2 HZ signal is applied through the switch to AND gate 162. Thus, AND gate 162 provides a high going pulse every 5 seconds. The output of AND gate 162 is connected to the clocking input of a flip-flop 163 which is connected as a one shot. The Q output of flip-flop 163 is connected to the J input of flip-flop 164. The Q output of flip-flop 164 is connected to one input of NAND gate 165. The CG signal, inverted by inverter 166 is connected to reset both flip-flops 163 and 164. If a CG signal arises before flip-flop 163 changes state, flip-flop 164 never becomes set. However, if the period of flip-flop 163 expires, then flip-flop 164 becomes set and NAND gate 165 produces a low going output. This is the persistence control pulse (PCP) which is provided as an input to OR gate 88. When the PCP signal is produced it appears, to the logic circuits illustrated in FIG. 8, as an integrate signal and the apparatus proceeds to produce a CG signal and attempts to perform a foldback process on the $e_x$ and $e_y$ signals. Of course, this is just a simulated operation which results in the identification of invalid data as there are no signals at $e_x$ and $e_y$ at this time since integration has not occurred. As a consequence of the production of the PCP signal, the oldest data which is identified by the state of WAC is replaced by a digital number 63. Thus, the oldest data has been erased and the 63, when decoded by the read apparatus will cause the display to be blanked.

Of course, for other range settings either the 0.4 or 1 HZ singals would be applied through the range switch to AND gate 162.

The reset switch, when operated, connects AND gate 162 to an 8 HZ signal produced by counter 160. As a result flip-flop 163 is continually cycled at an 8 HZ rate and thus, the oldest data contained in the storm scope memory is continually erased by the repetitive production of PCP signals.

The ADF signal provides for easy integration of an automatic direction finder. Switch S1 allows the same sensors to be shared by both storm scope and automatic direction finer. When the automatic direction finder is to be used throwing switch S1 to the unillustrated position connects the sensors. This also produces a high ADF signal to open switches 125 and 126 so that storm scope display is inhibited. Furthermore, since the storm scope continues to operate, the ADF signal also inhibits any decoded DI signals from blanking the CRT. In this fashion the same CRT may be used to display ADF information as well as storm scope information.

Those of ordinary skill in the art will understand that the provision of memory for storing data relating to location of electrical activity with respect to the observation location enables the display of this information a semi-static manner and provides many advantages over the prior art which was only capable of displaying the transient electrical activity at the time it occurred. However, if the apparatus is installed in a moving vehicle such as an aircraft, the changing location of the aircraft will slowly cause the data stored in the memory to become obsolete. Of course, since the memory size is finite and since new data is written over the older stored data, so long as the acquisition of new data occurs at a sufficiently fast rate in relation to the changing position of the vehicle obsolescence of the stored data is a minimal problem, if any. In those cases where data may become obsolete the persistance control pulse provides for the erasure of that data.

Modification of the disclosed apparatus, however, can provide updated data so that the display will indicate a real time relationship between the location of the electrical activity and the observation location. In order to explain the forgoing reference is made to FIG. 10D which illustrates a typical display of some electrical activity at point A. The observation location is, of course, the center of the display. If we assume that the display of FIG. 10D occurs at the time the electrical activity located at A is first sensed then, the display of FIG. 10D will give an accurate picture of the relationship between the electrical activity and the observation location. With a vehicle moving in one direction only, after a predetermined period of time the original activity, sensed at A, would have moved relative to the observation location to a new location A' (FIG. 10E). With the apparatus of the modification which is disclosed below, the display would show the activity at A' and not, at A. FIG. 10E, also shows, a new area of electrical activity at B. Finally, after the passage of additional time the display will be that shown in 10F. Note there that the first electrical activity sensed (A) has moved a distance (A-A') which is greater than the distance moved by the second area of electrical activity sensed (B-B') this is for the reason that the data sensed at A has been stored for a longer period of time and thus has been updated a greater number of times than the activity sensed at B.

Figure 10A:
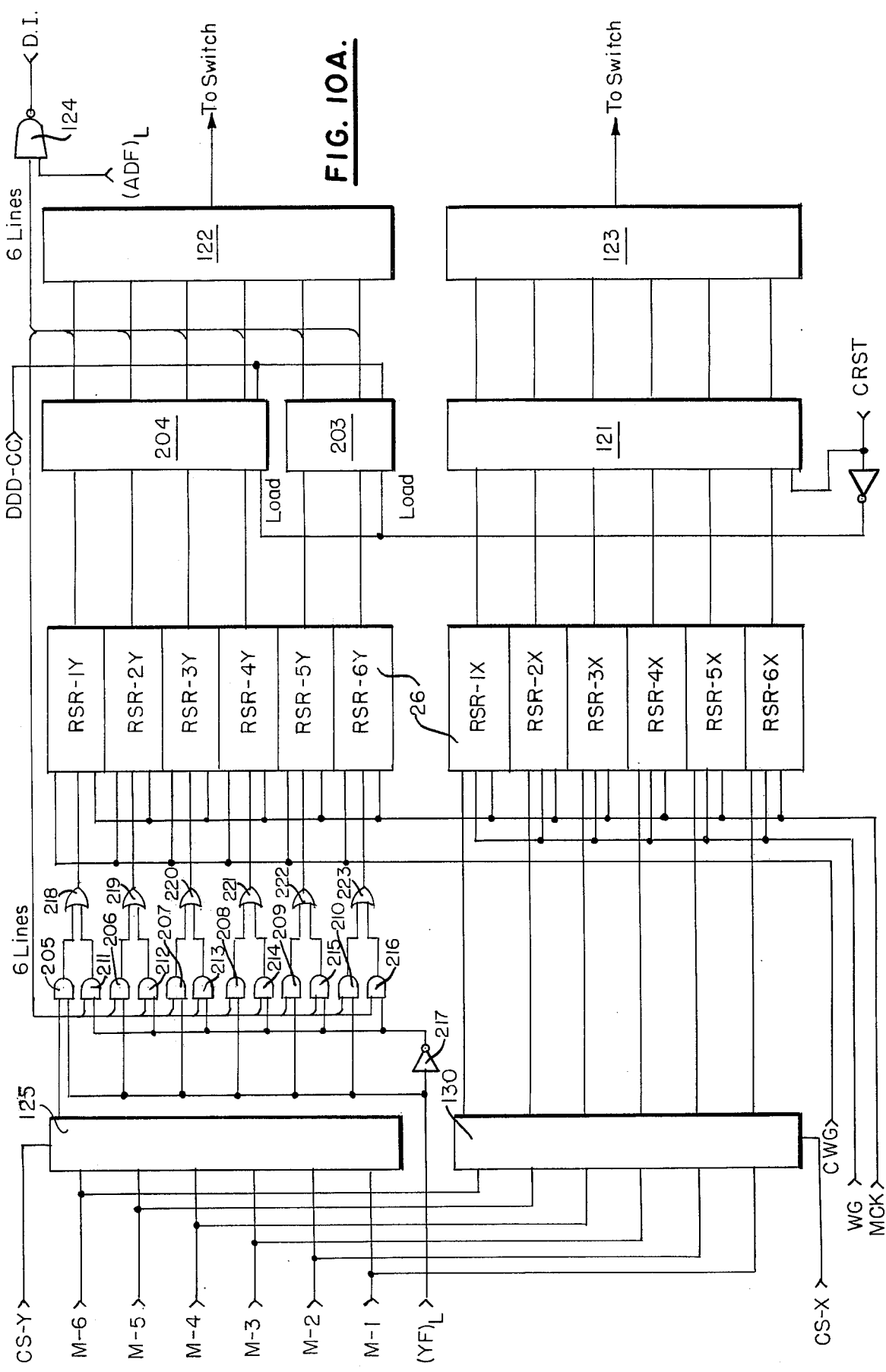
FIG. 10A is a schematic diagram of the modified memory apparatus to enable updating of stored data.
Figure 10B:
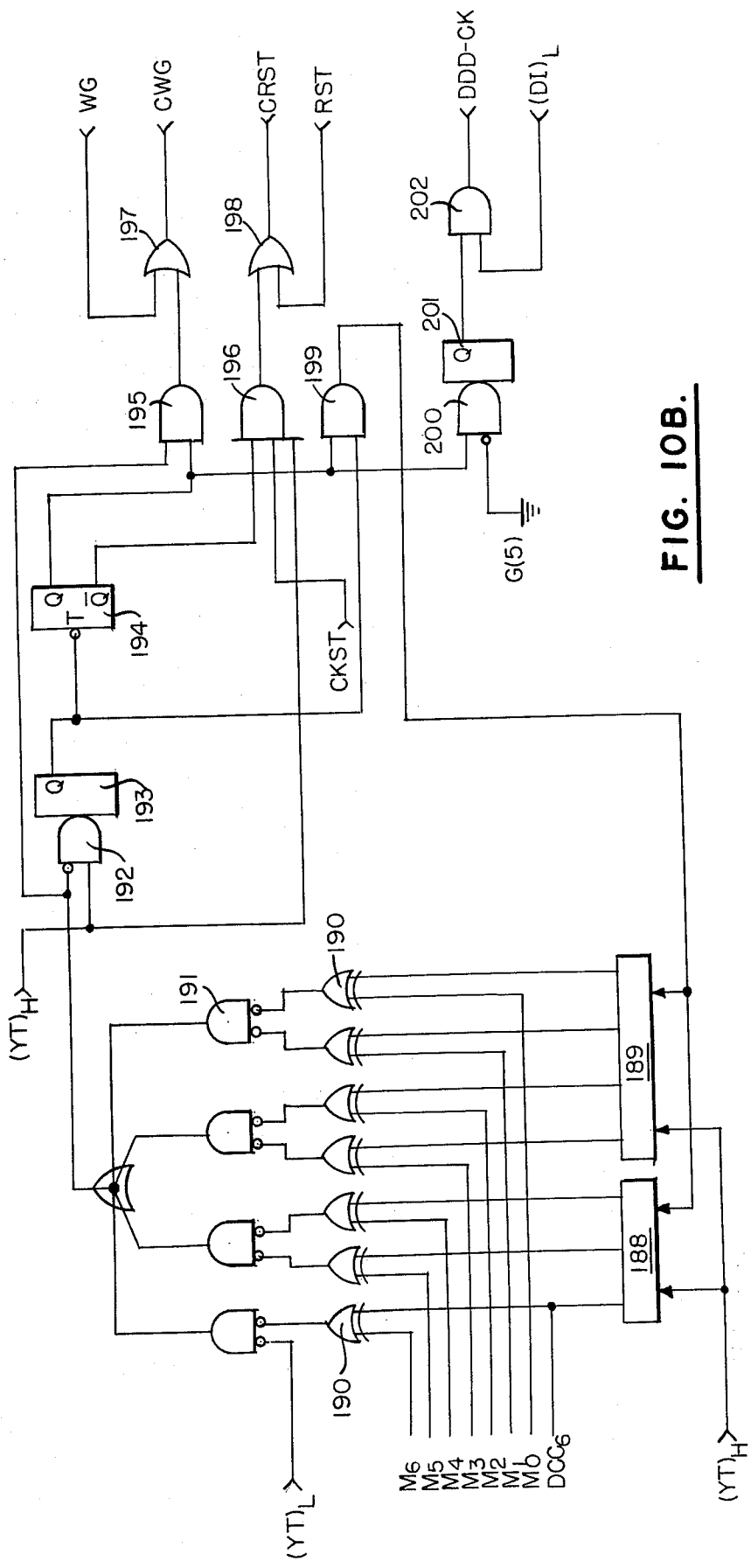
FIGS. 10B and 10C are schematic diagrams of the logic and clock synchronizer for operating the modified memory apparatus of FIG. 10A to enable updating of stored data.
Figure 10C:
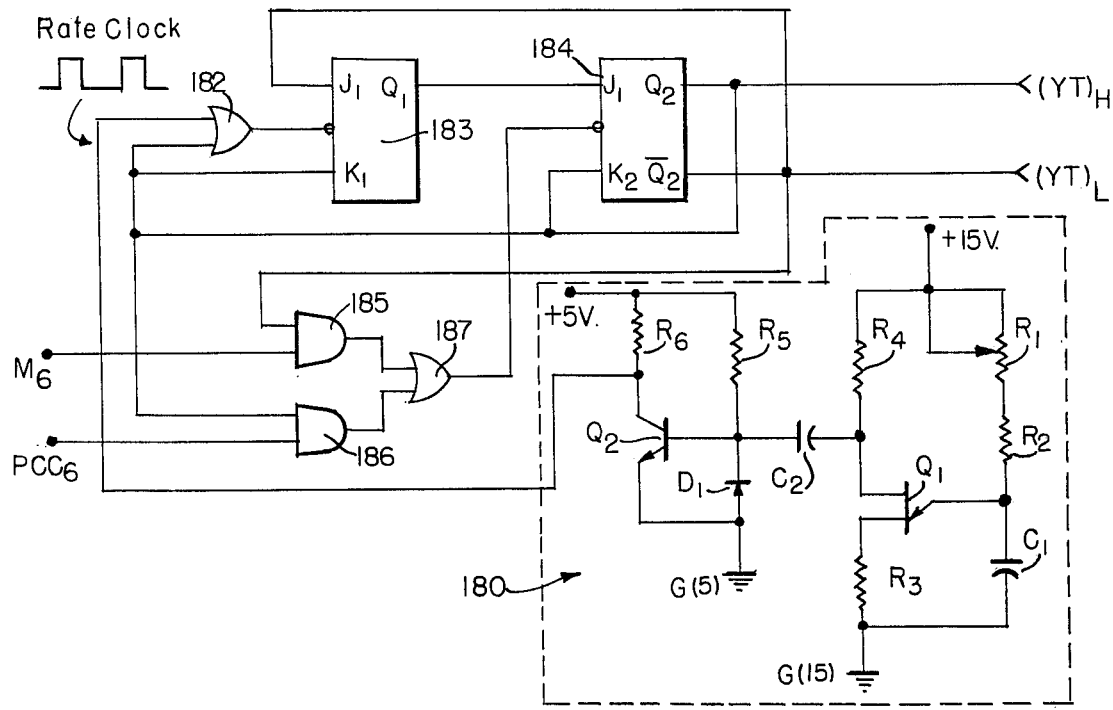
Figure 10D:
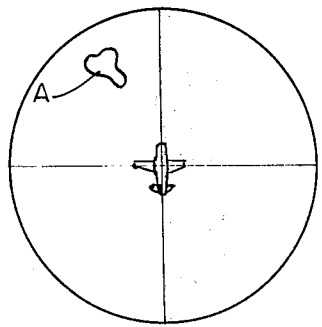
FIGS. 10D, 10E and 10F are schematic representations of display changes with the modified apparatus of FIGS. 10A – 10C.
Figure 10E:
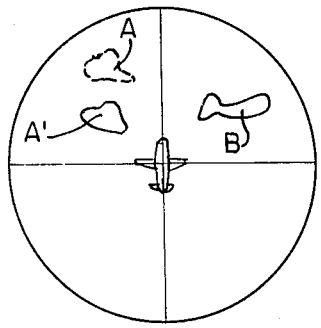
Figure 10F:
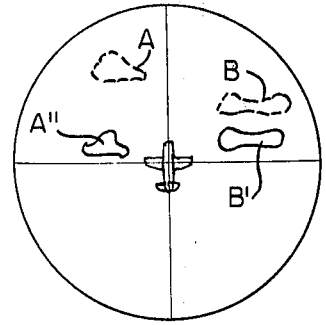

The apparatus illustrated in FIGS. 10A, 10B and 10C includes the logic for updating stored data, a clock for dictating the frequency of the updating operation and a modification to the memory apparatus of FIG. 7 to effect the updating function.

As a convenient example the updating may be arranged to occur at intervals in which the vehicle has moved a distance equivalent to 0.01 inches on the display. When the updating period expires the conversion apparatus is disabled so that new data cannot be acquired. The logic reads out a data word, updates the data by decrementing it by one count and returns it to the memory in it original location. The updating takes one memory cycle greater than the number of words in the memory. In the disclosed embodiment which employs a 128 word memory updating would require 129 memory cycles. At the conclusion of the updating operation the updating synchronizer is returned to its reset state and the acquisition apparatus is then again enabled to acquire new data On the next pulse of the updating rate clock the process is repeated. After a number of updating operations the Y coordinate display displacement will have been reduced to zero. On the next updating operation the Y display displacement will be reduced to one count below zero or a digital count of 111111. Since this is the display inhibit code this data will not be displayed and further updating will be inhibited. Of course, when and if new data is acquired for this memory word the new data will be rewritten into this word and updating will again occur.

FIG. 10C illustrates the rate clock which includes an oscillator 180 whose repetition rate is variable through a resistance R1. Since the display can be operated with three different ranges, of course, the clock frequency must be varied in accordance with the display range and nominal ground speed of aircraft. This is easily effected by varying the resistance R1. The output of the oscillator 180 is provided as one input to an OR GATE 182, the output of the OR GATE 182 is provided to the clocking input of a JK flip-flop 183. The Q output of the flipflop 183 is provided as the J input to another JK flipflop 184. The $\overline{Q}$ output of flipflop 184 is provided as one input to an AND GATE 185 whose other input is provided by the $M_6$ output of the memory address counter. Another AND GATE 186 receives an input from the Q output of flipflop 184. The other input to AND GATE 186 is a $PCC_6$ output. The PCC is a counter and the $PCC_6$ signal provided as an input to AND GATE 186 is one of the counter outputs. The outputs of AND GATE 185 and 186 provide the inputs to an OR GATE 187 whose output is connected to the clocking input of flipflop 184. The $\overline{Q}$ output of flipflop 184 is also provided as the J input to flipflop 183. The Q output of flipflop 184 is the $YT_H$ signal (Y-transform) and a $\overline{Q}$ output of flipflop 184 is the $YT_L$ signal (Y-transform negated). Between rate clock pulses flipflop 184 is reset, i.e., its $\overline{Q}$ output is high and its Q output is low. Since one of the inputs to OR GATE 182 is the Q output of flip-flop 184, this is low. The other input to OR Gate 182 is the clock output and therefore the output of OR GATE 182 follows the clock output. On the trailing edge of a clock pulse flipflop 183 is clocked to respond to its inputs. At this time, the J input is high (being the $\overline{Q}$ output of flipflop 184) and the K input is low (being the Q output of flipflop 184). Thus, flipflop 183 becomes set. AND GATE 185 is enabled by the $\overline{Q}$ output of flipflop 184. Thus, when the memory address counter output M6 goes high and output of AND GATE 185 goes high. At the conclusion of that period (memory address count of zero) M6 goes low and this trailing edge produces an negative going output from AND GATE 185 which is passed through OR GATE 187 and clocks set flipflop 184. At this time $YT_H$ goes high and $YT_L$ goes low which, as we will see, initiates the transformation operation. When the $\overline{Q}$ output of flipflop 184 goes low AND GATE 185 is disabled. However, AND GATE 186 is enabled by the Z outpuf of flipflop 184. Thus, when the counter output $PCC_6$ goes low this trailing edge will be passed through AND GATE 186, and through OR GATE 187 to clock flipflop 184 reset. Now, however, the K input of flipflop 184 will be high (it is connected to the Q output). Thus, flipflop 184 will become reset. This resetting action will provide a clocking input to flipflop 183 through OR GATE 182 and flipflop 183 will be reset (since the $\overline{Q}$ output of flipflop 184 is now high and Q output of flipflop 184 is low). The resetting action of flipflop 184 terminated the transformation operation since ($YT_H$) went low and ($YT_L$) went high. The resetting of flipflop 183 allows the next rate clock pulse to again initiate the cycle of operation.

FIG. 10B shows the updating logic apparatus. Provided as inputs to the logic circuit are ($YT_H$) and ($UT_L$), the memory address counter signals MO and M6, the WRITE GATE (WG), the READ STROBE (RST) and the display inhibit $(DI)_L$. This apparatus produces a COMPOSITE WRITE GATE (CWG), a composite READ STROBE (CRST), a data down date clock (DDD-CK) and the $PCC_6$ signal. Shown of FIG. 10B are two four bit counters 188 and 189. A plurality of exclusive OR GATES 190 have one input connected to a different output of the counters 188 and 189. And the second input to each of the exclusive OR GATES comes from one of the memory address counter outputs MO – M6. Since there are seven outputs from the counters 188 189 which are utilized there are seven exclusive or circuits. Pairs of exclusive or circuits have their outputs provided to AND GATES 191. The seventh exclusive or circuit 190 has its output provided to an AND GATE 191. The other output to this AND GATE 191 is ($YT_L$). The outputs of each of the AND GATES 191 are wired together in a wired or configuration and provide one input to AND GATE 192. The other input to AND GATE 192 is the signal ($YT_H$). The output of AND GATE 192 is connected to the input of a one shot 193 whose Q output provides a clocking input a "T", flipflop 194. The Q output of flipflop 19 provides one input to AND GATES 195,199 and 200. The output of flipflop 193 provides a second input to AND GATE 199. The $\overline{Q}$ output of flipflop 194 provides an input to AND GATE 196. The output of the wired or circuit also provides a second input to AND GATE 195. A second input to AND GATE 196 is the CLOCK STROBE (CK-ST). The third input to AND GATE 196 is the signal ($YT_H$). The second input to AND GATE 200 is provided by a permanent logic level. The output of AND GATE 195 provides one input to OR GATE 197 whose other input is the WRITE GATE (WG). The output of AND GATE 196 is one input to OR GATE 198 whose input is the READ STROBE (RST). The output of AND GATE 200 is the clocking input to 201 whose Q output provides an input to AND GATE 202. The other input to AND GATE 202 is the signal ($DI_L$).

When flipflop 184 (FIG. 10C) is set the signal ($YT_H$) goes high. Since this occurs when the memory address counter has cycled to zero the word at address zero is available at the output of the memory. At this time flipflop 194 is reset and therefore its $\overline{Q}$ output is high. When the CLOCK STROBE (CK-ST) is produced AND GATE 196 is enabled and this output is coupled through OR GATE 198 and is the combined READ STROBE (CRST). This enables the output of the memory, which is word zero, to be read into the output element which will be discussed in connection with FIG. 10A.

At the same time, however, the output of the two four bit counters 188 and 189 will be zero thus agreeing with the output of the memory address counter. The exclusive OR GATES 190 all produce low signals and as a result each of the AND GATES 191 will produce a high output and thus the wired OR signal will be high. This prevents AND GATE 192 from firing the one shot 193. However, as soon as the memory address counter moves to count one the output of the wired OR GATE goes low. This fires the one shot 193 whose output is a narrow positive pulse and sets flipflop 194. With flipflop 194 set, AND GATE 200 will fire the one shot 201. Its output may pass through AND GATE 202 as long as the display inhibit signal is not low. The output of AND GATE 202 is the data down date clock (DDD-CK). The effect of this signal will be seen when we refer to FIG. 10A.

During this time the memory address counter is cycling and when it again reaches zero the wired OR GATE output again goes high for one period of the clock since the counters 188 and 189 still maintain a count of zero. This high output now enables AND GATE 195 to pass a signal through OR GATE 197. This signal is the COMPOSITE WRITE GATE (CWG). The effect of this signal will be seen in reference to FIG. 10A. It is sufficient to say here, however, that the signal DDD-CK decremented the output of the memory for this data word and the CWG signal allowed the decremented word to be rewritten into the memory.

At the conclusion of the clock period when the wired OR GATE output goes low flipflop 193 is again fired. Since the AND GATE 199 is now enabled the narrow output pulse of flip-flop 193 passes therethrough and increments the count in the four bit counters 188 and 189. This counter now contains a count of one which immediately agrees with the memory address counter which has now also been incremented to one. The same pulse which passed through AND GATE 199 again triggers flipflop 194 so now its $\overline{Q}$ output is high its Q output is low. Thus, on the occurrence of CK-ST AND GATE 196 now produces CRST to read the contents of the first memory word into the memory output. As a memory address counter now counts up to two the wired OR output goes low, since this four bit counters 188 and 189 are still holding a count of one. This forgoing signal again triggers flipflop 193 to now set flipflop 194. Since flipflop 194 had been reset a further pulse has not passed through AND GATE 199. However, when flipflop 194 becomes set AND GATE 200 is enabled to produce a narrow pulse from one shot 201 which may pass through AND GATE 202 so long as the inhibit code is absent. This again produces DDD-CK to down date the contents of the first memory word which is now residing in the memory output. When the memory address counter again reaches a count of one it will agree with the count in the four bit counters 188 and 189 the high going output of the wired OR GATE now passes a pulse through AND GATE 195 (which is enabled since the flipflop 194 is set). This produces CWG to now write the down dated contents of memory word one back into the first memory word. And the cycle continues.

If, during the cycle of operation the display inhibit code is present the output of one shot 201 will not pass AND GATE 202 and therefore a DDD-CK signal will not be produced. This has the effect of maintaining the memory word outside its previous value. Since the display inhibit considered in response to the count of 111111 this count will be retained. Thus on each succeeding update cycle this count will inhibit itself from the being displayed or further inhibit itself from being decremented.

At the conclusion of the down dating process the most significant bit ($PCC_6$) will go low. Referring again to FIG. 10C we see that the effect of this low going transition is to reset flipflop 184 and thus ($YT_H$) goes low terminating the updating process.

To see the manner in which the CWG, CRST and DDD-CK pulses are utilized reference is now made to FIG. 10A.

FIG. 10A illustrates a modification to the memory apparatus of FIG. 7. Where identical apparatus has been retained the identical reference characters are maintained. As in FIG. 7 memory address counter outputs are provided to the six bit latches 125 and 130. FIG. 10A is divided into upper and lower portions. The upper portion relates to the six bits Y axis data and the lower portion relates to the six bits of X data. As seen by reference to FIG. 10A the X axis apparatus is maintained essentially unchanged. The differences to the X axis apparatus is the application to the output latch 121 of CRST instead of RST and the removal of gate 124 which produces the signal DI.

With respect to the Y axis data the output latch 120 has been replaced by a two bit down counter 203 and four bit down counter 204. The outputs of these counters are provided, as before to a digital analog convertor 122.

The output of the input latch 125 is applied now, not to the recirculating memories 1Y to 6Y but instead to one input of AND GATES 205 through 210. A second input to each of these gates is ($YT_L$).

One of the six outputs of counter 203 and 204 is provided respectively to a different one of AND GATES 211 through 216. A second input to each of these AND GATES is provided by ($YT_L$) in an inverter 217. The output of one of the AND GATES 205 to 210 and the output of the corresponding one of AND GATES 211 through 216 is provided to an OR GATE 218 through 223.

Thus, in writing when ($YT_L9$ is high AND GATES 205 through 210 will be enabled thus the memory will operate in the same manner as the unmodified memory. However, when ($YT_L$) is low (when the updating process occurs) the AND GATES 205 through 210 will be disabled and the AND GATES 211 through 216 will be enabled. Since these AND GATES couple the outputs of counters 203 and 204 to the memory registers 1Y through 6Y we can now feed back the output of the recirculating registers to the input through the counters 203 and 204. The further input to counters 203 and 204 is signal DDD-CK. The occurrence of this signal acts to decrement by one count the contents of the counters.

By now the operation of this modified apparatus should be clear. At a rate determined by the oscillator 180 the transformation process is initiated. At that time disabling gate's 205 through 216 prevents any newly acquired data, which may exist in the latch 125 from passing on to the memory. As each word is read into the counters 203 and 204 it is decremented by one count by the operation of DDD-CK which is produced by AND GATE 202 unless the display inhibit signal is produced by AND GATE 124. As the memory cycles around, the decremented data is then rewritten through AND GATES 211 through 216 and through OR GATES 218 through 223 back into the memory. After a sufficient number of memory cycles all the data in the memory has been decremented by one count and the apparatus returns to its normal method of operation. In order to prevent the acquision of new data the signal ($YT_H$) can be connected to the clear inputs of flip-flops 92 and 93 (FIG. 8A) to prevent the apparatus to FIG. 8A from going through a conversion operation. With the apparatus as modified by the illustrations of FIGS. 10A through 10C the need for the persistence control pulse and the apparatus which produces it (as shown in FIG. 9) has been obviated and thus that apparatus can be dispensed with. Since the memory output for the Y axis data, counters 203 and 204, is also connected to the D/A converter 122 the display operation continues unhampered by the decrementing operation which can occur simultaneously.

The period of oscillator 180 is determined by two factors, one is the vehicle speed and the second is the display range. Assuming normal aircraft cruising speed of say 200 miles per hour, and assuming a 100 nautical mile range the data should be decremented once every 24 seconds in order that decrementing take place in an interval corresponding to vehicle movement of 0.01 inches on the display. With a 50 nautical mile range decrementing should occur every twelve seconds and with a 20 nautical mile range decrementing should occur every five seconds.

It should be understood that although a particular embodiment has been disclosed with reference to the detection and display of electrical activity related to thunderstorms, the invention may be used to display any electrical activity to which the storm scope will respond. Likewise although the embodiment disclosed included particular implementations of the foldback, memory and correlation functions, those of ordinary skill in the art will understand that these functions may be implemented with equivalent apparatus such as analog foldback using analog dividing circuits, random access memories and the like. The particular apparatus of the disclosed embodiment should not be construed to limit the invention, instead reference is made to the appended claims.

What is claimed is:

1. A system for detecting electrical disturbances generated by weather phenomena, and for displaying such disturbances for ready observation with reference to an observation location comprising,
   receiving means for receiving electrical signals generated by said weather phenomena in a predetermined frequency band,
   processing means, connected to said receiving means, for processing said received signals and providing processed signals whose amplitude is inversely related to said received signals, and
   display means driven by said processed signals to display said processed signals by designating locations, relative to said observation location, determined by said processed signals,
   whereby received signals of relatively large magnitude will be displayed relatively close to said observation location and received signals of relatively smaller magnitude will be displayed relatively far from said observation location.

2. The system of claim 1 in which said receiving means generates a pair of received signals, the amplitude of which represent the coordinates of said electrical activity with respect to said observation location.

3. The system of claim 2 in which said processing means includes first means responsive to both said received signals and produces a first signal whose amplitude is directly related to the square of at least one of said received signals.

4. The system of claim 3 in which said first means produces a first signal directly related to the sum of the squares of said received signals.

5. The system of claim 4 in which said processing means further includes second means responsive to both said received signals and said first signal and produces a pair of foldback output signals, the amplitude of each is related to the ratio of one of said received signals and said first signal.

6. The system of claim 3 in which said processing means further includes second means responsive to both said received signals and said first signal and produces a foldback output whose amplitude is related to the ratio of at least one of said received signals and said first signal.

7. The apparatus of claim 1 which further includes memory means connected to said processing means and to said display means,
   said memory means including logic means for determining when processed signals are available for storage in said memory means and storage means for storing said processed signals.

8. The apparatus of claim 7 which further includes, second logic means connected to said storage means and said display means for reading out said processed signals from said storage means for display by said display means.

9. The apparatus of claim 7 wherein said storage means comprises recirculating shift register means.

10. The apparatus of claim 9 wherein said recirculating shift register means comprises a plurality of recirculating shift registers.

11. The apparatus of claim 1 wherein said receiving means includes a plurality of receivers respectively responsive to electric and magnetic fields.

12. The apparatus of claim 11 in which said receiving means includes a first receiver responsive to electric fields and second and third receivers respectively responsive to magnetic fields.

13. The apparatus of claim 11 in which said receiving means includes a first receiver responsive to electric fields and second and third receivers respectively responsive to time rates of change of magnetic fields in orthogonal directions.

14. The apparatus of claim 13 which further includes correlating means for producing correlated outputs of said first and second receivers and said first and third receivers.

15. The apparatus of claim 1 in which said receiving means includes a plurality of receivers and correlating means for correlating the outputs of said plurality of receivers.

16. The apparatus of claim 1 in which said receiving means includes a comparator for comparing a one of said received signals with a threshold and a plurality of timers initiated for a predetermined period when said received signal exceeds said threshold.

17. The apparatus of claim 16 in which said receiver further includes integrating means controlled by said timers to integrate at least some of said received signals for a predetermined period.

18. The apparatus of claim 1 which includes a memory means connected to store the processed signals and including readout means for, at times, providing such processed signals to said display means.

19. The apparatus of claim 18 in which said memory means stores a number of processed signals equal to the capacity of said memory means.

20. The apparatus of claim 19 in which currently processed signals are stored by said memory means to replace the oldest data previously stored in said memory means.

21. The apparatus of claim 19 in which said memory means includes write counter means continually indicating the location of the oldest processed signal stored in said memory means, and storing means to store currently processed signals in a location indicated by said write counter means.

22. The apparatus of claim 21 in which timing means compares time elapsed between occurrences of received signals and operates said memory means to delete data stored in locations identified by said write counter means if said elapsed time exceeds a predetermined period.

23. The apparatus of claim 18 which includes means for modifying said stored processed signals in light of movement of said observation location and in which said memory means comprises a digital memory means, said means for modifying said data comprising, means for selecting an interval within which said stored data is to be modified and for producing a signal at the expiration of said interval, logic means responsive to said signal for preventing the storage of new data during the time modification is being effected, said logic means reading stored data from said memory means, modifying said data in a predetermined manner and storing said modified data in the same memory location from which said data is read, said logic means resetting itself after operating on all data stored in said memory means.

24. The apparatus of claim 32 in which said digital memory means comprises a plurality of recirculating shift registers.

25. The apparatus of claim 24 in which said logic means modify said data by decrementing each word of said data.

26. The apparatus of claim 23 in which said digital memory means includes a pair of digital memories, each of said pair storing data relating to one of two orthogonal coordinates of said weather phenomena, and in which said logic means reads, modifies and writes from and into only one of said pair of digital memories.

27. The apparatus of claim 26 in which each of said pair of digital memories comprises a plurality of recirculating shift registers.

28. A system for separately detecting a plurality of electrical disturbances generated by weather phenomena and for producing signals related to the coordinates of said plurality of electrical disturbances with respect to an observation location, comprising:

receiving means for receiving electrical signals generated by said weather phenomena in a predetermined frequency band, correlating means, connected to said receiving means for producing correlated received signals, integrating means for integrating said correlated received signals, and switching means responsive to said received signals for limiting the period of operation of said integrating means.

29. The apparatus of claim 28 in which said receiving means receives a pair of signals related to orthogonal components of the magnetic field generated by said weather phenomena, vectorial signal summing means, connected to said receiving means for summing said received signals, a threshold means connected to said last named means producing a signal when said summed signal exceeds a threshold, said threshold means controlling said switching means.

30. The apparatus of claim 29 includes timing means operated by said threshold means.

31. The apparatus of claim 30 in which said switching means includes a first switch connecting a correlated received signal to said integrating means, and a second switch for short circuiting said integrating means.

32. The apparatus of claim 31 in which said timing means includes a first and second timer, said first timer closing said first switch for a predetermined first time, and a second timer opening said second switch for a second predetermined time.

33. The apparatus of claim 32 in which said first time is 0.5 seconds.

34. The apparatus of claim 32 in which said second time is greater than said first time and equal to 0.8 seconds.

35. The apparatus of claim 28 in which said switching means includes a first switch connecting a correlated received signal to said integrating means, and a second switch for short circuiting said integrating means.

* * * * *